US008612196B2

(12) United States Patent
Rosedale et al.

(10) Patent No.: US 8,612,196 B2
(45) Date of Patent: Dec. 17, 2013

(54) SYSTEM AND METHOD FOR DISTRIBUTED SIMULATION IN WHICH DIFFERENT SIMULATION SERVERS SIMULATE DIFFERENT REGIONS OF A SIMULATION SPACE

(75) Inventors: Philip E. Rosedale, San Francisco, CA (US); Cory R. Ondrejka, Pleasant Hill, CA (US); Andrew L. Meadows, Fairfax, CA (US)

(73) Assignee: Linden Research, Inc., San Francisco, CA (US)

( * ) Notice: Subject to any disclaimer, the term of this patent is extended or adjusted under 35 U.S.C. 154(b) by 2047 days.

(21) Appl. No.: 10/289,124

(22) Filed: Nov. 5, 2002

(65) Prior Publication Data
US 2003/0195735 A1    Oct. 16, 2003

Related U.S. Application Data

(60) Provisional application No. 60/371,743, filed on Apr. 11, 2002.

(51) Int. Cl.
*G06F 17/50* (2006.01)
*G06T 15/00* (2011.01)

(52) U.S. Cl.
USPC ............................................ 703/13; 345/419

(58) Field of Classification Search
USPC ................ 463/42, 43, 33; 709/202; 715/706; 345/633, 629, 640, 672, 674, 687; 703/13
See application file for complete search history.

(56) References Cited

U.S. PATENT DOCUMENTS

| 4,463,380 | A | | 7/1984 | Hooks, Jr. |
| 4,715,005 | A | | 12/1987 | Heartz |
| 5,097,412 | A | | 3/1992 | Orimo et al. |
| 5,498,003 | A | * | 3/1996 | Gechter .......................... 463/31 |
| 5,519,848 | A | | 5/1996 | Wloka et al. |
| 5,564,107 | A | | 10/1996 | Atalla |
| 5,594,915 | A | | 1/1997 | Atalla |
| 5,652,871 | A | | 7/1997 | Steinman et al. |
| 5,659,691 | A | * | 8/1997 | Durward et al. .............. 709/204 |
| 5,673,198 | A | | 9/1997 | Lawman et al. |
| 5,704,026 | A | * | 12/1997 | Wan ............................. 345/590 |
| 5,715,184 | A | | 2/1998 | Tyler et al. |
| 5,736,990 | A | * | 4/1998 | Barrus et al. .................. 345/630 |
| 5,795,228 | A | * | 8/1998 | Trumbull et al. .............. 463/42 |
| 5,801,938 | A | | 9/1998 | Kalantery |
| 5,802,296 | A | * | 9/1998 | Morse et al. .................. 709/208 |
| 5,805,824 | A | | 9/1998 | Kappe |
| 5,815,793 | A | | 9/1998 | Ferguson |
| 5,841,980 | A | * | 11/1998 | Waters et al. .................. 463/42 |

(Continued)

OTHER PUBLICATIONS

Locales: Supporting large Mutiuser Virtual Environments; Barrus, J.W.; Waters, R.C.; Anderson, D.B.; Computer Graphics and Applications, IEEE; vol. 16, Issue 6, Nov. 1996 pp. 50-57.*

(Continued)

*Primary Examiner* — Akash Saxena
(74) *Attorney, Agent, or Firm* — Vierra Magen Marcus LLP

(57) ABSTRACT

Distributed continuous simulation of a three dimensional simulation space is provided using a set of simulation servers. The simulation space is partitioned into a set of regions. In one embodiment, each simulation server is responsible for simulating one of the regions of the simulation space. Users interacting with the simulation communicate directly with the simulation server responsible for simulating the region that the user is currently interacting with.

8 Claims, 19 Drawing Sheets

(56) References Cited

U.S. PATENT DOCUMENTS

| | | | |
|---|---|---|---|
| 5,844,594 A | 12/1998 | Ferguson | |
| 5,850,345 A | 12/1998 | Son | |
| 5,881,267 A | 3/1999 | Dearth et al. | |
| 5,890,963 A * | 4/1999 | Yen | 463/42 |
| 5,910,903 A | 6/1999 | Feinberg et al. | |
| 5,920,862 A * | 7/1999 | Waters | 707/10 |
| 5,923,330 A * | 7/1999 | Tarlton et al. | 345/419 |
| 5,929,861 A | 7/1999 | Small | |
| 5,941,770 A * | 8/1999 | Miers et al. | 463/13 |
| 5,956,028 A * | 9/1999 | Matsui et al. | 345/419 |
| 5,956,038 A * | 9/1999 | Rekimoto | 345/419 |
| 5,956,039 A * | 9/1999 | Woods et al. | 345/419 |
| 5,963,731 A | 10/1999 | Sagawa et al. | |
| 6,003,065 A | 12/1999 | Yan et al. | |
| 6,020,885 A * | 2/2000 | Honda | 709/203 |
| 6,025,801 A * | 2/2000 | Beitel | 342/457 |
| 6,031,987 A | 2/2000 | Damani et al. | |
| 6,052,555 A | 4/2000 | Ferguson | |
| 6,085,222 A * | 7/2000 | Fujino et al. | 709/202 |
| 6,106,297 A | 8/2000 | Pollak et al. | |
| 6,106,399 A * | 8/2000 | Baker et al. | 463/42 |
| 6,108,494 A | 8/2000 | Eisenhofer et al. | |
| 6,110,217 A | 8/2000 | Kazmierski et al. | |
| 6,126,548 A | 10/2000 | Jacobs et al. | |
| 6,134,514 A | 10/2000 | Liu et al. | |
| 6,183,364 B1 | 2/2001 | Trovato | |
| 6,191,800 B1 | 2/2001 | Arenburg et al. | |
| 6,192,388 B1 | 2/2001 | Cajolet | |
| 6,253,167 B1 * | 6/2001 | Matsuda et al. | 703/11 |
| 6,341,262 B1 | 1/2002 | Damani et al. | |
| 6,348,927 B1 * | 2/2002 | Lipkin | 345/619 |
| 6,421,047 B1 | 7/2002 | de Groot | |
| 6,532,007 B1 * | 3/2003 | Matsuda | 345/419 |
| 6,552,721 B1 * | 4/2003 | Ishikawa | 345/418 |
| 6,672,961 B1 * | 1/2004 | Uzun | 463/31 |
| 6,704,724 B2 * | 3/2004 | Matsuda et al. | 709/224 |
| 6,746,332 B1 * | 6/2004 | Ing et al. | 463/42 |
| 6,767,287 B1 * | 7/2004 | Mcquaid et al. | 463/42 |
| 6,783,460 B2 * | 8/2004 | Galyean et al. | 463/40 |
| 6,801,930 B1 * | 10/2004 | Dionne et al. | 463/42 |
| 6,807,521 B1 * | 10/2004 | Kurosawa et al. | 703/22 |
| 6,826,523 B1 * | 11/2004 | Guy et al. | 703/22 |
| 6,947,761 B2 * | 9/2005 | Hutcheson et al. | 463/42 |
| 6,949,022 B1 * | 9/2005 | Showers et al. | 463/16 |
| 7,065,549 B2 * | 6/2006 | Sun et al. | 709/201 |
| 7,086,005 B1 * | 8/2006 | Matsuda | 715/706 |
| 2002/0049087 A1 * | 4/2002 | Ushiro et al. | 463/42 |
| 2002/0049814 A1 * | 4/2002 | Yoo | 463/42 |
| 2002/0049832 A1 * | 4/2002 | Ullman et al. | 709/218 |
| 2002/0169863 A1 * | 11/2002 | Beckwith et al. | 709/223 |
| 2003/0008712 A1 * | 1/2003 | Poulin | 463/42 |
| 2003/0045360 A1 * | 3/2003 | Hora | 463/42 |
| 2003/0177187 A1 * | 9/2003 | Levine et al. | 709/205 |
| 2003/0227479 A1 * | 12/2003 | Mizrahi et al. | 345/753 |
| 2004/0018876 A1 * | 1/2004 | Kubota et al. | 463/42 |
| 2004/0147324 A1 * | 7/2004 | Brown | 463/42 |
| 2005/0227767 A1 * | 10/2005 | Shimomura et al. | 463/42 |
| 2006/0148545 A1 * | 7/2006 | Rhyne et al. | 463/1 |
| 2006/0258462 A1 * | 11/2006 | Cheng et al. | 463/42 |

OTHER PUBLICATIONS

Exploiting Reality with Muticast Groups; M.R. Macedonia et al; Virtual Reality; IEEE 1995; pp. 38-45.*
Migration Process; Dejan S. MiloJicic et al; ACM Computing Surveys, vol. 32, No. 3 Sep. 2000 pp. 241-299.*
Computer Games' Influence on Sientific and Information Visualization; Theresa Marie Rhyne; Computer IEEE Dec. 2000; p. 154-156.*
Opportunities Online: Fact or Fantasy?; James Sanders; IEEE Software 1998; p. 62-64 & 122.*
The Simnet Virtual World Architecture; James Calvin et al; LORAL Advanced Distribution Simulation, Inc; IEEE 1993.*
Networked Vitual Environments; Brian Blau et al; ACM 1992.*
UO Auto Map Update Log; http://www.uoam.net/uoamlog.html; Entries in 1999 relating to server transitions.*
A Java Based Applet Virtual Environment as an Usable Interface to Distributed Services and Collaborative Applications on the Internet; F. Pirri et al ; IEEE 1999.*
A Language for Creating and Manupulating VRML; T.J.Parr et al; ACM 1995.*
The Out of Box Experience: Lessons Learned Creating Compelling VRML 2.0 Content; Sam Chen et al ; Silicon Graphics; ACM 1997.*
A Middleware Approach to Building Large Scale Open Shared Virtual Worlds; Anne Gerodolle et al; IEEE 2000.*
UO Stratics Server Information http://web.archive.org/web/20010623211324/http://uo.stratics.com/content/misc/servip.shtml#4.*
The ANSI C (Internal) Spline Version 3.0 Application Program Interface; R. Waters, D. Anderson; 1997 http://www.merl.com.*
MVIP fifth symposium on Virtual reality modeling language (Web3D-VRML) Publisher: ACM Press.*
Management of Large Amounts of Data in Interactive Building Walkthroughs; Thomas A. Funkhouser et al; ACM 1992.*
Design of the server cluster to support avatar migration; Jiung-yao Huang Yi-chang Du Chien-Min Wang; Virtual Reality, 2003. Proceedings. IEEE Date: Mar. 22-26, 2003.*
Inside Massive-3: Flexible Support for Data Consistency and World Structuring ; C Greenhalgh, J Purbrick, D Snowdonn—. . . the third international conference on Collaborative virtual, 2000—equator.ecs.soton.ac.uk.*
Collaborative Virtual Environments; Steve Benford, Chris Greenhalgh, Tom Rodden, and James Pycock; Communications of the ACM Jul. 2001/vol. 44, No. 7.*
A Scalable Architecture for Supporting Interactive Games on the Internet; Wentong CAI et al; 2002 IEEE.*
Evolving Orbit: a progress report on building locales; Tim Mansfield et al; Group 97 Phoenix Arizona USA Copyright 1997 ACM.*
Sewing Worlds Together With Seams: A Mechanism to Construct Large-Scale Virtual Environments; Gernot Schaufler and Dieter Schmalstieg; MIT Press Journel Presence—Teleoperators and Virtual Environments pp. 449-461; 1999; citeseer.ist.psu.edu/315502.html.*
A scalable architecture for supporting interactive games on the internet Wentong Cai; Xavier, P.; Turner, S.J.; Bu-Sung Lee; Parallel and Distributed Simulation, 2002. Proceedings. 16th Workshop on May 12-15, 2002 pp. 54-61.*
278-1993 IEEE standard for information technology—protocols fordistributed interactive simulations applications. Entity information andinteraction Publication Date: May 12, 1993E-ISBN: 1-55937-305-9.*
A Load Balancing Algorithm for a Distributed Multimedia Game Server Architecture; Dugki Min', Eunmi Choi', Donghoon Lee', Byungseok Park, IEEE 1993, p. 882-886.*
1278-1993IEEE standard for information technology—protocols fordistributed interactive simulations applications. Entity information andinteraction Publication Date: May 12, 1993E-ISBN: 1-55937-305-9INSPEC Accession No. 4437106Sponsored by: Hyperlink Computer Society.*
Belabbas Yagoubi et al, pp. 90-95, Paper presented in World Academy of Science, Engineering and Technology 2006, "Dynamic Load Balancing Strategy for Grid Computing".*
Zaki, M. J.; Wei Li; Parthasarathy, S.; , "Customized dynamic load balancing for a network of workstations," High Performance Distributed Computing, 1996., Proceedings of 5th IEEE International Symposium on , vol., No., pp. 282-291, Aug. 6-9, 1996.*
Web page for Butterfly.net at www.butterfly.net, 2001.
Web page for Ultima Online at www.uo.com, 2000.
Web page for Everquest at www.everquest.station.sony.com, 2002.
Miller, Advanced OpenGL Texture Mapping, www.nate.scuzzy.net, Mar. 24, 2000.
T.K. çapin et al., "Avatars in Networked Virtual Environments," John Wiley & Sons, Inc., pp. 15-57, ch.2, A Taxonomy of Networked Virtual Environments, 1999.

* cited by examiner

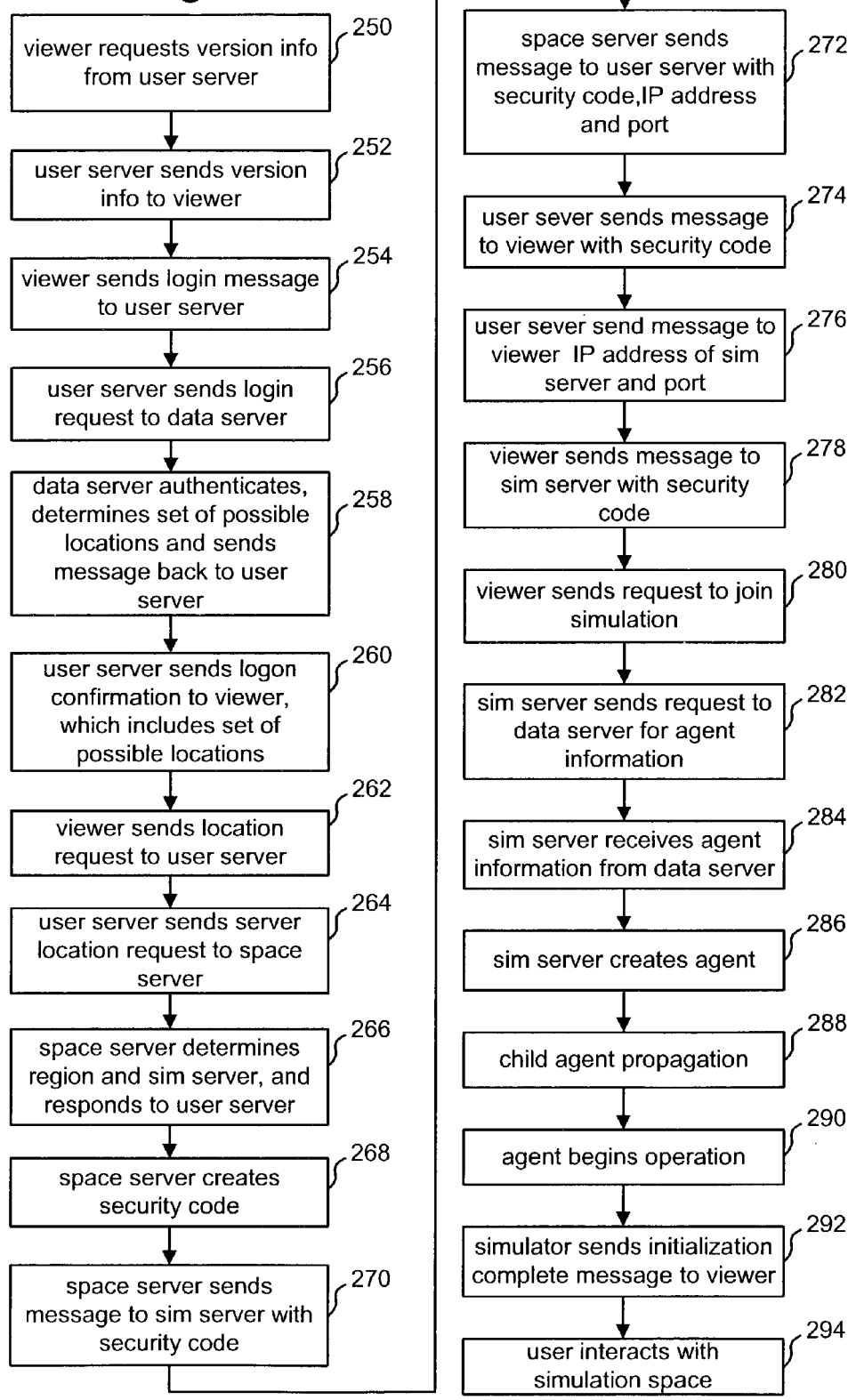

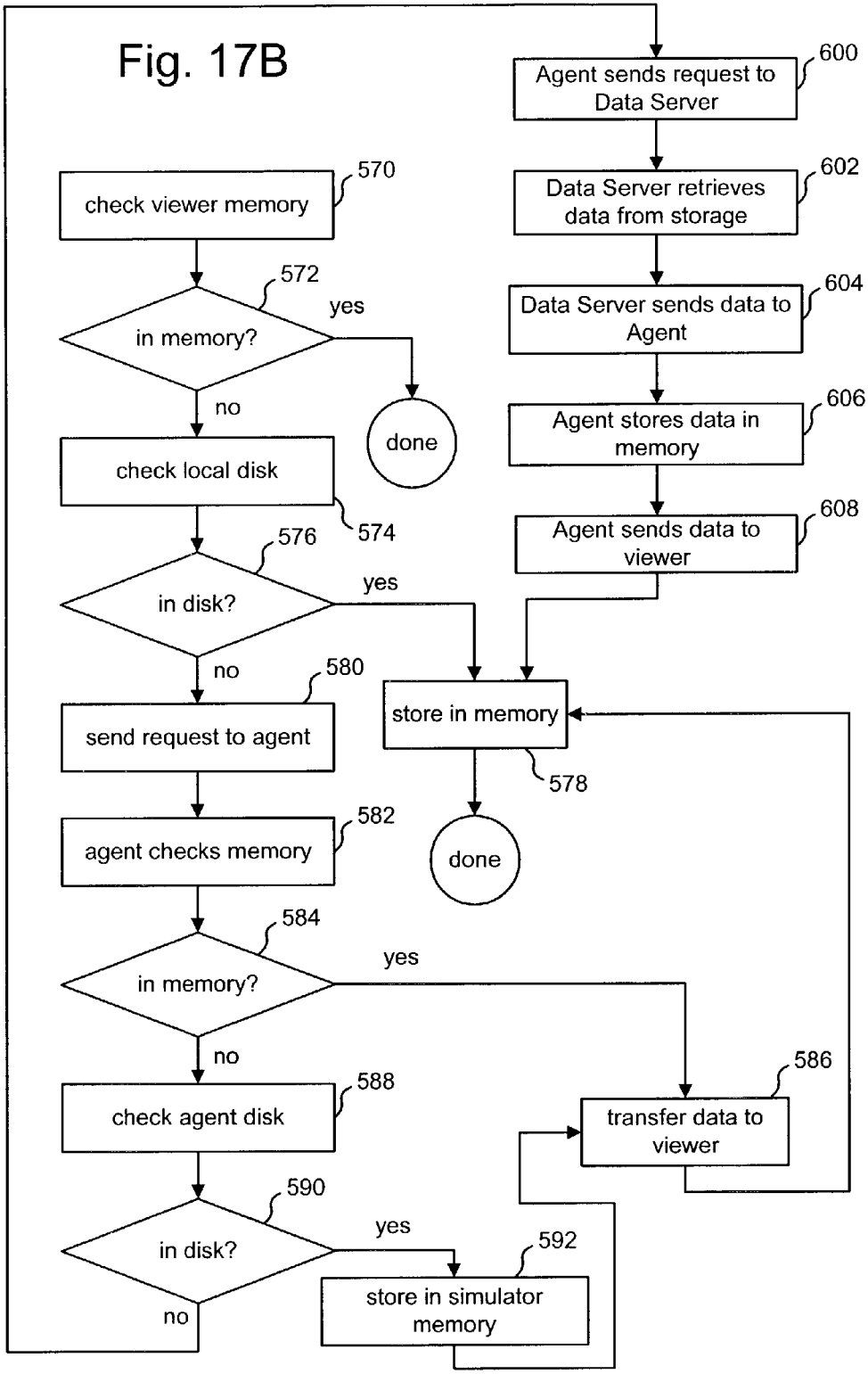

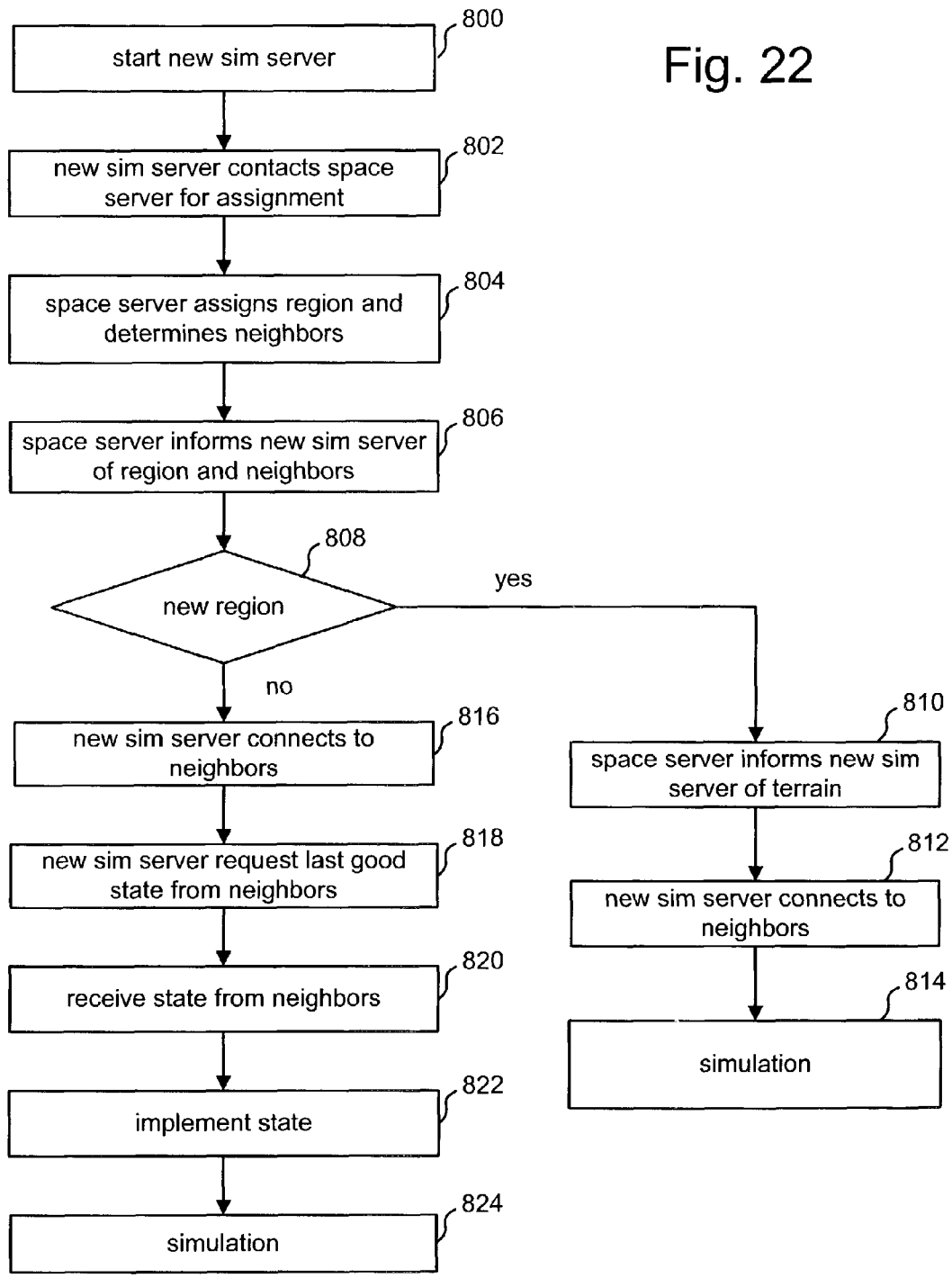

SYSTEM AND METHOD FOR DISTRIBUTED SIMULATION IN WHICH DIFFERENT SIMULATION SERVERS SIMULATE DIFFERENT REGIONS OF A SIMULATION SPACE

This application claims the benefit of U.S. Provisional Application No. 60/371,743, entitled, "Simulation of a Large Virtual Space Using A Distributed Network," filed on Apr. 11, 2002, incorporated herein by reference.

BACKGROUND OF THE INVENTION

1. Field of the Invention

The present invention is directed to a simulation system.

2. Description of the Related Art

A common type of interactive computer experience is the simulation. In its most general sense, a simulation is the imitative representation of the functioning of a system or process. In many cases, a user is presented with a representation of some experience, such as performing an activity. There are many types of simulators. One well known example is a flight simulator, in which a user interacts with a computer that provides the user with a visual experience of flying an aircraft. Simulators can be used for training, research, entertainment, education, as well as many other suitable activities.

With the increasing sophistication of both computer hardware and the uses of simulation systems, it has become desirable to integrate multiple users simultaneously into a simulation. In some cases, multi-user simulation is accomplished by having two users independently carry out much of the simulation and share enough data to place one another within their respective simulations. However, such arrangements are often inefficient or ineffective when more than just a small number of individual users of the simulation are simultaneously involved.

Other multi-user simulations may involve the use of a single large central computer. Users may send or receive data from the central computer, while computationally intensive operations are performed on the central computer. In such simulations, the amount of computation involved may exceed the capabilities of many computers systems. Other systems may subdivide the simulation space, but not in a contiguous way. Yet another system uses a grid of computers to carry out the simulation; however, the simulation is not continuous and there is not a one to one correspondence between locations on the grid and a specific computer.

The above described simulation systems place the burden of computing the behavior of the environment on the user's computer or central computer. For example, the physics of a rocket salvo or the behavior of a group of angry monsters must be calculated in real time by the computer before being provided to the presentation system for display or rendering. This load greatly reduces the number of different objects or interactions that can be involved in the simulation, as well as the overall richness of the experience presented to the end user.

Similarly, today's simulation experiences are also limited by the size of the computer's memory and storage devices, which determine the size of the simulation space that can be explored. The simulation space is the process, real world location, virtual world, device, other system being simulated.

Therefore, there is a need for an improved simulation system in which multiple users may interact with the environment and with each other.

SUMMARY OF THE INVENTION

The present invention, roughly described, pertains to a system that can provide a continuous distributed simulation of a simulation space. In one implementation, the system includes a set of simulation servers, the simulation space is divided into regions and each region is simulated by at least one simulation server.

One embodiment includes a simulation system for performing a continuous distributed simulation of a three dimensional simulation space. The simulation system includes a set of simulation servers. The simulation space is divided into regions. Each simulation server is assigned to simulate one of the regions. Each simulation server communicates using UDP (or another protocol) with neighboring simulation servers, including providing simulation space and object information pertaining to areas near the borders of the regions. Each simulation server in view creates agent processes for communicating with users.

The simulation space can include a set of objects and continuous dynamic systems. Examples of an object include a person, monster, animal, automobile, aircraft, building, sign, light source, sound source, etc. An object can also be a component of a more complex object, such as a door in a building. Examples of continuous dynamic systems include weather, bodies of water, land masses, etc.

One embodiment of the present invention includes associating each region of the simulation space with one or more simulation servers. Each simulation server simulates its corresponding region using only a subset of the simulation data. Multiple simulation servers can report about different objects that can be perceived by a single viewer within their receptive associated region. For example, a user currently located in a first region may be able to see objects in additional neighboring regions. The simulation servers for the neighboring regions will transfer data about those perceived objects to the user.

In one implementation, the system can dynamically maintain communication between the user and simulation servers associated with the regions having objects perceivable by the user. This includes starting communication in real time between the user and a simulation server associated with the region having an object that becomes perceivable to the user and stopping communication in real time between the user and a simulation server associated with the region that ceases to have objects or continuous dynamics that are perceivable to the user.

Some embodiments of the present invention also include a system for facilitating the joining of an entity to the distributed simulation. The system receives a request from the user to join the simulation and identifies a location for the entity in response to the request. The location is in one of the regions in the simulation space. The system identifies a particular simulation server based on a stored partition map and the region where the location resides, and informs the entity of an address for contacting the identified particular simulation server.

Some embodiments of the present invention also include a system for facilitating the joining of a new simulation server to the simulation system. A first server is informed that a new simulation server is available to join the plurality of simulation servers. Information is received from the first server identifying a first region in the simulation space and one or more simulation servers that simulate regions neighboring the first region. The new simulation server communicates with the simulation servers that simulate regions neighboring the first region, and the new simulation server simulates the first region. In one embodiment, all or a portion of the above process is performed while the plurality of simulation servers are simulating the simulation space.

Because of the volume of data that can be transferred between the simulation servers and the users, some embodiments use various techniques to limit the amount of data transferred. One example is to interpolate changes in the simulation environment. One example of a suitable technique is dead reckoning; however, other techniques can also be used. Changes are interpolated by the simulation servers using dead reckoning and, if the dead reckoning results are similar to the actual changes, then the data about the changes need not be transmitted to the user. Rather, the user can perform the dead reckoning in order to update the display of the simulation.

Another technique used by some embodiments for reducing the amount of data transmitted is to compress image data using a lossy compression scheme that supports progressive transmission and decompression of the image data. For images that are far away, a very small amount of data is sent and decompressed into a low resolution image. As the image becomes closer to the user (and, therefore, is more visible e.g. bigger), more data is sent and higher resolution images are constructed. One implementation of such a technique includes determining first resolution information for the image, transmitting to said user only enough data to display the image at the first resolution, receiving and decoding the data at the user's client, and displaying the image at the first resolution. Subsequently to displaying the image, and in response to the user moving closer to the image in the simulation environment (or another event), second resolution information for the image is determined. Only enough additional data to display the image at the second resolution is transmitted to and received at the client. The image is decoded and displayed at the second resolution.

The present invention can be accomplished using hardware, software, or a combination of both hardware and software. The software used for the present invention is stored on one or more processor readable storage media including hard disk drives, CD-ROMs, DVDs, optical disks, floppy disks, tape drives, RAM, ROM or other suitable storage devices. The software is used to program a computing system with one or more processors, storage elements in communication with the processor(s) and communication interfaces in communication with the processor(s). In alternative embodiments, some or all of the software can be replaced by dedicated hardware including custom integrated circuits, gate arrays, FPGAs, PLDs, and special purpose computers.

These and other objects and advantages of the present invention will appear more clearly from the following description in which the preferred embodiment of the invention has been set forth in conjunction with the drawings.

BRIEF DESCRIPTION OF THE DRAWINGS

FIG. 9 is a flowchart describing one embodiment of the process for a user joining a simulation.

FIG. 17B is a flowchart describing one embodiment of a process for acquiring a texture or audio data.

FIG. 22 is a flowchart describing one embodiment of a process for adding a new simulation server.

DETAILED DESCRIPTION

The present invention can be used to simulate a simulation space. Examples of a simulation space include a surface, a region of air space, a volume of water, a building, a body, an imaginary world, outer space, a building, a cave, a portion of the Earth, a mechanical device, an electrical device, an optical device, or anything else imaginable that can be modeled. Additionally, the simulation space can be a combination of any of the above. In many cases, the simulation space will be a three dimensional environment. However, the simulation space can also be a two-dimensional environment, or other than two or three dimensions.

Figure 1:
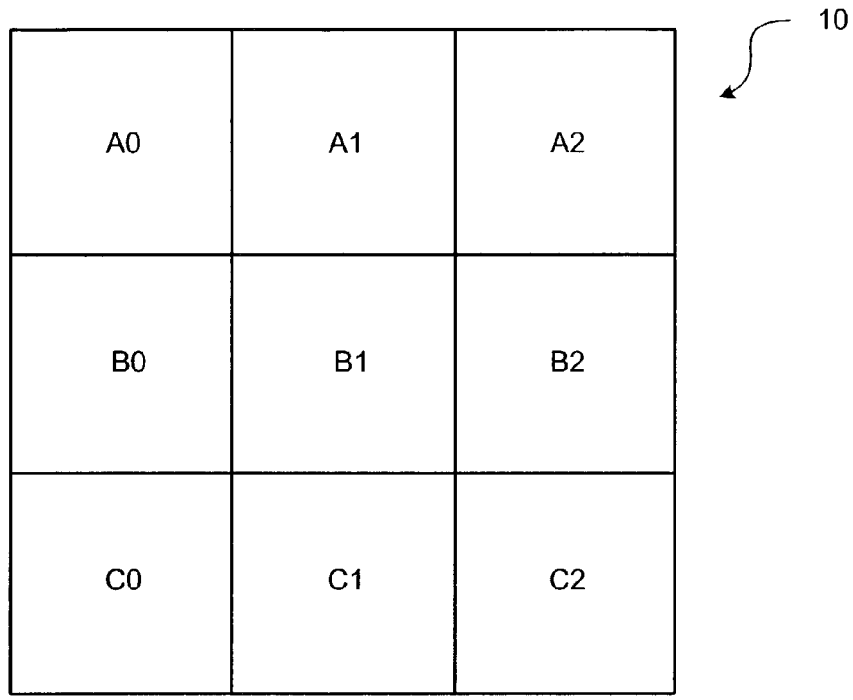
FIG. 1 provides a top view of one example of a simulation space partitioned into regions.

One embodiment of the present invention partitions the simulation space into a set of regions so that each location in the simulation space is located in a region. FIG. 1 shows simulation space 10 divided into nine regions, A0, A1, A2, B0, B1, B2, C0, C1, and C2. FIG. 1, which depicts a top view of the three dimensional simulation space 10, shows the regions as being equally sized and square-shaped. It is contemplated that the regions extend vertically to cover all space above and below the surface. The regions are contiguous in that the neighboring regions share edges so that the simulation space appears to be one continuous space. In one embodiment, the partitioning of the simulation space into regions is transparent to the user. That is, because the regions are contiguous and continuous, the user can roam within the simulation space without knowing that they are passing into different regions.

Figure 2:
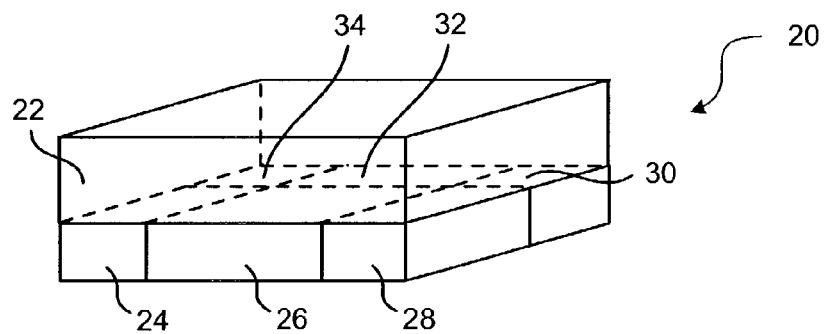
FIG. 2 is a perspective view of a second example of a simulation space partitioned into regions.

Although FIG. 1 shows simulation space 10 having equally sized regions, a simulation space may not necessarily have to be divided in to equally sized regions. Additionally, the regions can be any shape. For example, FIG. 2 shows a second embodiment of a simulation space. Simulation space 20 is divided into regions 22, 24, 26, 28, 30, 32 and 34. These regions are not equally sized. For example, regions 24, 26, and 28 are deeper than regions 30, 32 and 34. Additionally, region 26 is wider than regions 24 and 28. Region 22 is substantially bigger than any of the other regions. There are many reasons why different size regions may be used. For example, it may be a goal to have relatively equal number of objects in the different regions and because users may want to put more objects in certain parts of the simulation space, the regions may be divided unequally to accommodate different amounts of objects in different places. Additionally, regions may be created to include all of a body of water, all of a weather system, etc., or to limit boundary crossings by objects, users, environmental systems, etc.

Figure 3:
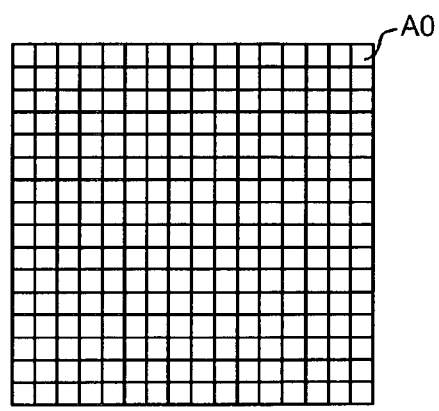
FIG. 3 provides one example of how to divide a region in the simulation space into a set of bins.

In one embodiment, each region (or a subset of regions) is partitioned into a set of bins. For example, FIG. 3 shows a region A0 divided by a grid to create a set of bins (e.g. bin 40). In one embodiment, the grid is a 16×16 grid of equally sized bins. In other embodiments, more or less bins can be used, and unequal sized bins can be used. In the embodiment shown in FIG. 3, the bins extend upward and downward. The bins are used to partition simulation data for the region. It is contemplated that the data for a region will be stored in one or more data structures such that data for a particular bin is stored with (or in relation to) other data for that particular bin in some logical fashion. For example, there can be a separate data structure for each bin. Use of the bins makes searching for data more efficient.

Figure 4:
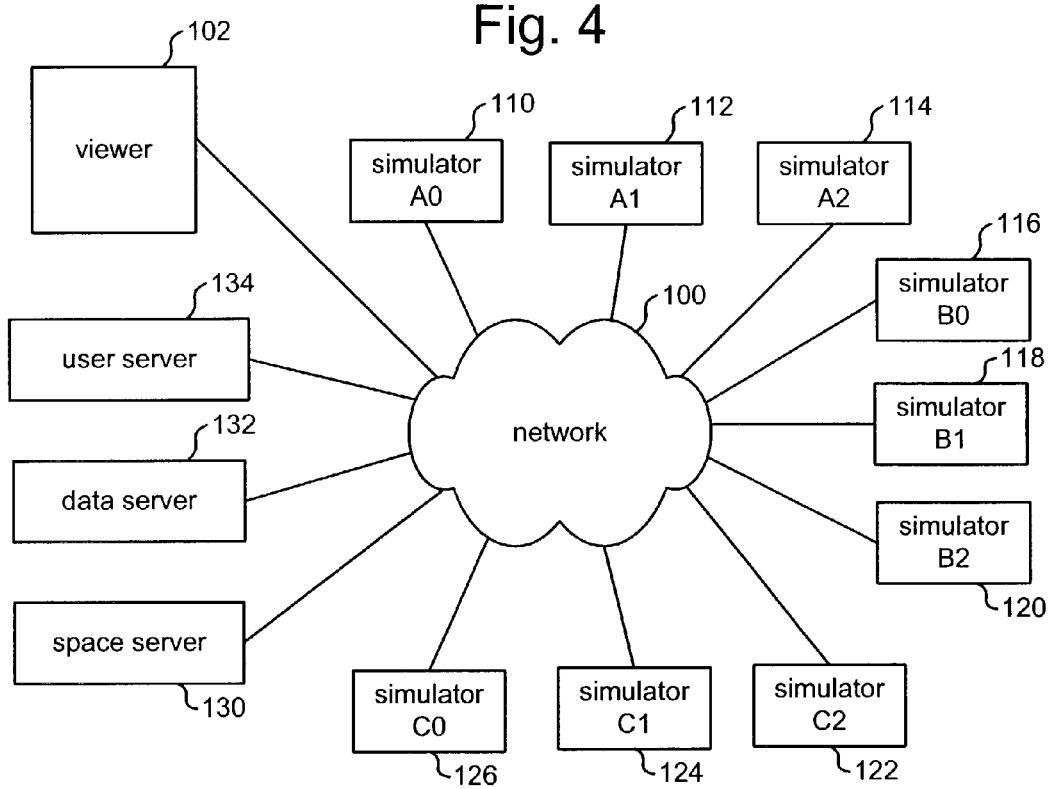
FIG. 4 is a block diagram of the various components of one embodiment of the present invention.

FIG. 4 is a block diagram of the various components of one embodiment of the present invention. FIG. 4 shows network 100 which could be the Internet, a LAN, a WAN, a VPN, or any other network or combination of networks. In addition, network 100 can also be a wireless network, optical network, etc. The present invention is not necessarily tied to any particular type of network. What is important is that the various components, or at least a subset of the various components, can communicate as described herein. FIG. 4 shows viewer 102. In one embodiment, viewer 102 is client software running on a computing device operated by a user who is interacting with the simulation space. Viewer 102 can operate on a personal computer, laptop computer, handheld computing device, mobile telephone, or any other computing device which can communicate with network 100.

The simulation system includes a set of simulation servers. FIG. 4 shows simulation servers 110, 112, 114, 116, 118, 120, 122, 124, and 126. Although FIG. 4 shows nine simulation servers, more or less than nine simulation servers can be used. In one embodiment, there is one simulation sever for each region in the simulation space. For example, simulation server 110 corresponds to region A0, simulation server 112 corresponds to region A1, simulation server 114 corresponds to region A2, simulation server 116 corresponds to region B0, simulation server 118 corresponds to region B1, simulation server 120 corresponds to region B2, simulation server 122 corresponds to region C2, simulation server 124 corresponds to region C1, and simulation server 126 corresponds to region C0. In other embodiments, more than one simulation server can be used to simulate a region or a simulation server can be used to simulate multiple regions. Each of the simulation servers is responsible for storing simulation data for and simulating the region that corresponds to that simulation server. Each simulation server also communicates with those simulation servers simulating regions that neighbor the region being simulated by the particular simulation server. For example, simulation server 112 communicates with simulation server 110, simulation server 114, and simulation server 118. This is because simulation server 112 simulates region A1. The regions that neighbor region A1 include region A0, region A2, and region B1. The simulation servers for those regions are simulation servers 110, 114, and 118. In one embodiment, simulation servers communicate with each other using UDP. Other protocols can also be used.

From the above discussion, it is clear that the simulation of the simulation space is distributed among the various simulation servers. Additionally, the simulation is said to be continuous because, while the simulation is distributed among various servers, it appears to the viewer as one simulation of one environment. The partitioning of the space into regions and the distribution of the simulation effort is invisible to the user.

FIG. 4 also shows space server 130, data server 132, and user server 134. User server 134 manages the connection of users to the simulation system. Data server 132 manages data that is used in the simulation system. For example, data server 132 can manage texture data, audio data, user data, environmental data, and any other data that is needed by the simulation system. In one embodiment, data server 132 and/or user server 134 can include a database, a directory system, or any other data storage system suitable for the particular implementation.

Space server 130 is responsible for storing and maintaining a table (or other data structure) of correspondence between the individual simulation servers and the various regions simulated by those simulation servers. This table (or other data structure) of correspondence is known as a "partition map." For example, the partition map will indicate that simulation server 110 simulates region A0, simulation server 112 simulates region A1, etc. For each simulation server in the partition map, space server 130 will store the IP address for the simulation server. In embodiments that do not use IP addresses, other identifiers or addresses can also be used. In addition to storing the partition map, space server 130 is responsible for assigning a region to a simulation server. For instance, if a particular simulation server goes off-line, space server 130 can assign a new server to take over the role of simulating the particular region corresponding to the server that went off-line. Space Server 130 is also involved in the initial connection of users to the simulation system. The partition map is initially set up by the space server at the start of a simulation session and then is dynamically maintained in real time during the simulation.

The simulation servers, user server 134, data server 132 and space server 130 can be software servers running on a set of computers, with one or more servers on any given computer. Alternatively, each server can be a separate computer. General purpose computers with communication interfaces (e.g. network cards), storage elements (memory and disk drives), and one or more processors in communication with the above can be used. Special purpose computers can also be used. A variety of platforms and operating systems can be used such as Windows, Linux, Unix, Mac OS, etc. Communication can be performed through many suitable protocols. One example is using UDP. TCP/IP can also be used, as well as others.

Simulation space 10 is likely to contain a variety of objects with which users of the simulation space will interact. Examples of objects include buildings, roads, bridges, automobiles, living organism, boats, airplanes, clouds, caves, rocks, trees, houses, hills, rivers, and any other thing that can be in a virtual or real world, system, process or thing. The objects can be stationery or mobile, living or non-living, real or pretend, etc. There is no requirement that a single feature or physical item be represented as a single computational object. For instance, a complex object might be represented by dozens or hundreds of individual objects. For example, doors and windows could be some of the objects that comprise a building object. The nature of the system as described herein is not changed by the number of objects used to represent any physical aspect of the simulation space.

Figure 5:
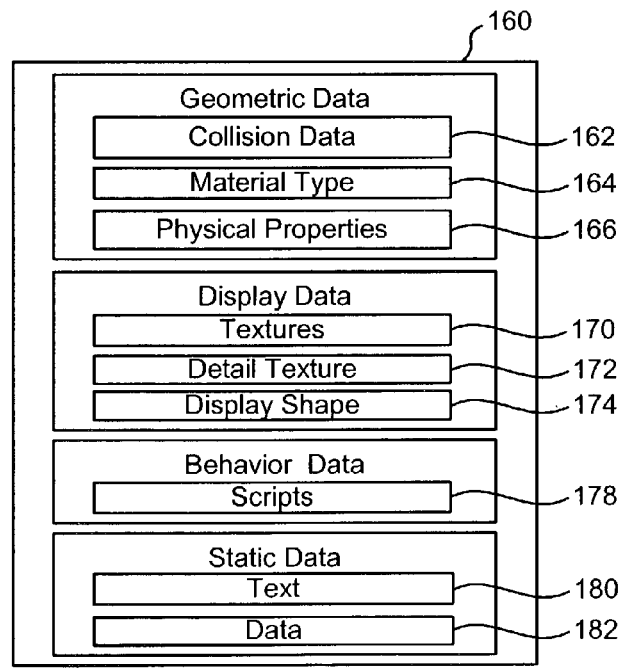
FIG. 5 is a block diagram depicting an example of a data structure for storing information about an object in the simulation space.

FIG. 5 is a block diagram that provides an exemplar framework for a data structure storing the information for an object in the simulation space. The data structure is broken up into geometric data, display data, behavioral data, and static data. The geometric data is used to perform a physical simulation and includes collision data 162, material type 164 and physical properties 166. Collision data 162 indicates the shape of the object that will be used for physical simulation. Material type 164 describes the type of material that makes up the object and can be used for such things as audio cues. For example, when struck, a metal object makes a different sound than a rubber object. The material type can also be used to explain behavior during collisions. Physical properties 166 includes such things as mass, density, coefficient of friction, restitution, etc.

The display data is used to indicate how to display the particular object and is typically sent to a viewer. The display data includes textures 170, detail texture 172, and display shape 174. Textures 170 includes the image that is depicted on an object when displayed. Detailed texture 172 describes how the object looks when a viewer zooms in on the object. For example, if the object is made of wood, the detailed texture will depict the grain of the wood. Display shape 174 is the shape that is displayed. It is possible that the display shape can be different than the shape stored in collision data 162.

Behavioral data includes one or more scripts 178. A script is a set of instructions that describe how the object behaves under certain situations. The script can be written in various computer programming languages or with a proprietary program language written for the particular implementation. In one implementation, a language similar to the C programming language is used. Examples of a script include instructions for how to behave when the object is touched, when the object bounces, when the object is cold, etc.

Static data includes text 180 and data 182. Text 180 includes text that is displayed when the object is selected. There can be restrictions on who can see this text. Data 182 is data that is presented to a viewer when the object is selected. Examples of data 182 include audio and images.

To manage scalability while still allowing events in the simulation to have potentially global effects, the system uses the idea of an environmental lattice. The environmental lattice is used to simulate continuous environmental conditions such as surface, terrain, weather conditions, water, light conditions, etc. The environmental lattice is an evenly spaced (unevenly spaced in some embodiments) grid of values extending across a region. Depending on the type of lattice, some form of discretized physical simulation is run to compute the time evolution of the lattice. For example, land or water values can be stored as heights at each grid point. A mass-spring approximation can be used to compute the new height of water based on its prior height and the values for neighboring heights. Similar physical methods are used to compute wind (e.g. modeled as a 2-D fluid), pressure, humidity, and any other lattice relevant to the simulation. The density of the grid points can be scaled to allow reasonable performance. In one embodiment, an interpolation is used to compute values between grid points.

Figure 6:
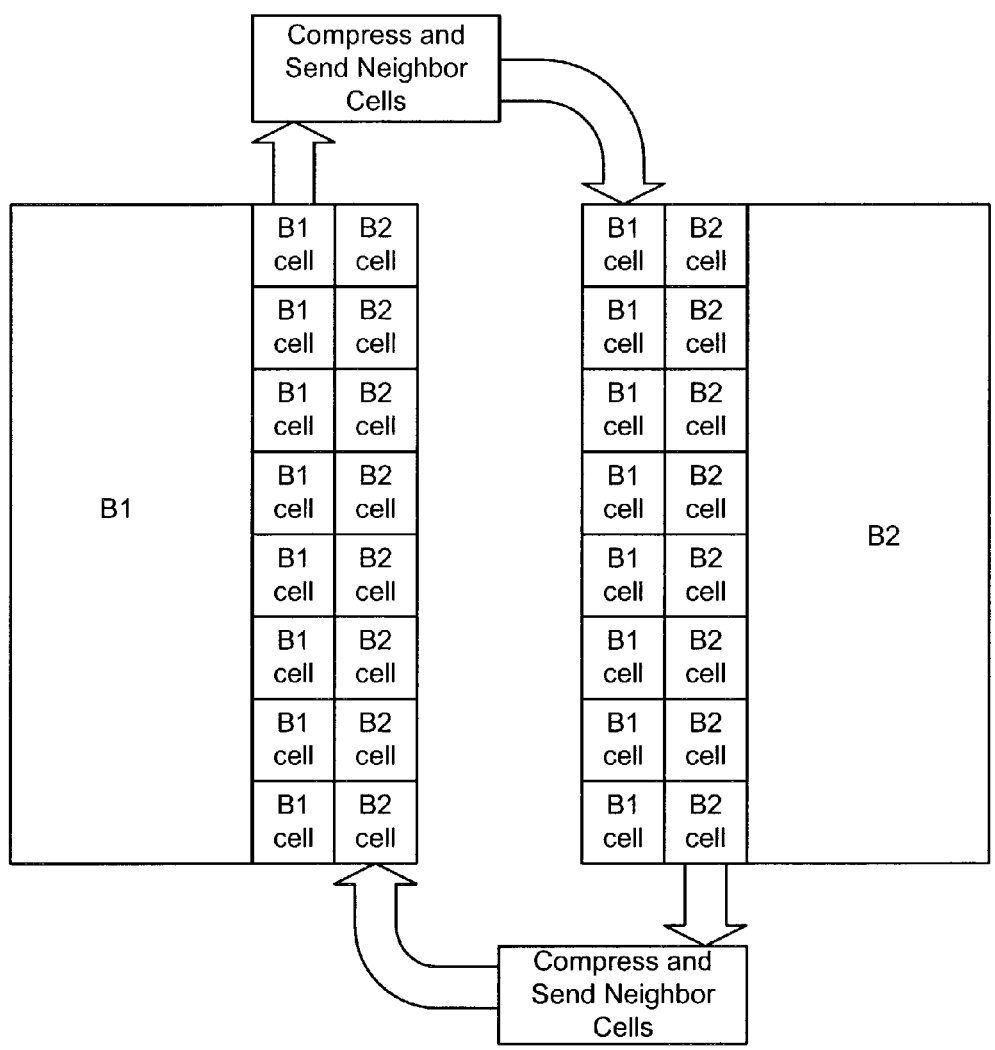
FIG. 6 depicts communication of environmental data between neighboring regions.

In one implementation, a simulation space may have multiple environmental lattices, with each lattice used to simulate a different environmental condition. Each environmental lattice is considered a layer. A layer of the simulation space is broken up into a grid of cells and the environment is broken up into a set of vector value points, with one point for each cell in the grid. Each layer will be simulated separately. In another embodiment, the layers can be simulated as a group. When simulating a layer for a particular region, the simulation server for that region will taken into account the data for the layer in the regions immediately adjacent to the region being simulated. For example, FIG. 6 shows two regions, B1 and B2. Region B1 is broken up into a number of cells and region B2 broken up into a number of cells, where each cell stores a particular vector value for the particular layer. If a layer was the land surface, then each vector value will represent a height value for the height of the land at the center of that cell. The row of cells in region B1 that are immediately adjacent to the region B2 are communicated to region B2 by compressing the data and sending it to simulation server 120, which is simulating region B2. Additionally, the data for the cells in B2 that are immediately adjacent to region B1 are compressed and communicated to simulation server 118, which simulates region B1. This way, each simulation server when simulating the layer for its particular region will take into account the row of cells immediately adjacent to that layer. Thus, simulation server 118 simulating B1 will take into account a row of cells from B2, a row of cells from C1, a row of cells from B0 and a row of cells from A1. In other embodiments, more than one row of cells will be considered from each neighboring region.

Figure 7:
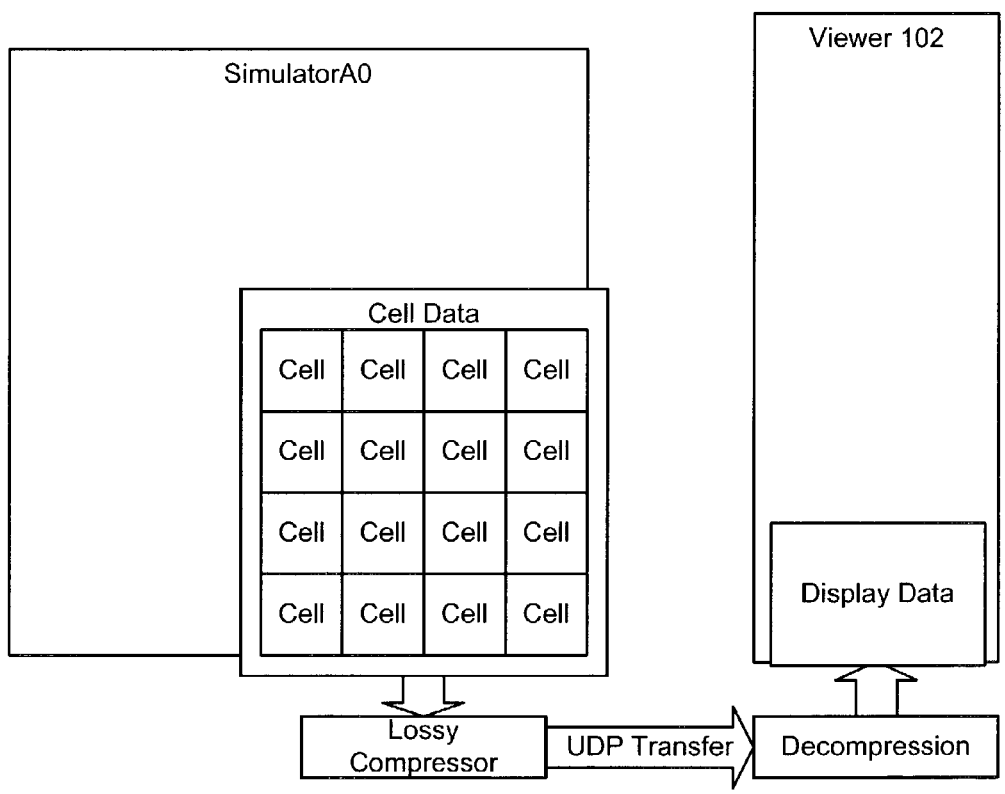
FIG. 7 depicts communication of environmental data from a simulator to a viewer.

FIG. 7 shows how a region of cells that are viewable by user are sent to viewer 102. The region of cells are compressed using lossy compression as will be discussed below and sent via UDP to viewer 102. Upon receipt at viewer 102, the cells are decompressed and displayed to a user. In one embodiment, the various environmental data can be compressed using various levels of compression such that data for portions of the environment that are close to the user will be compressed with less loss while data for the portions of the environment that are further from the viewer and harder to see will be subject to greater compression involving greater loss. This is because a person can be expected to see things up close up in extreme detail, but things far away may be somewhat harder to see. Typically, the greater the amount of compression, then the smaller the amount of data that is transferred, but the greater the loss of information.

Each simulation server is responsible for simulating the region (or, in some embodiments, regions) associated with that simulation server. As part of the simulation, the simulation server performs a rigid body physics and collision analysis. Each object is analyzed based on its geometric data, position data and movement data to determine whether it collided and/or where/how it moves. In addition, the simulation server performs the continuum dynamics analysis which includes simulating the behavior of the various levels of environment conditions discussed above which may include land, weather, water, etc. The simulation servers also run the scripts of the objects and run agent processes (discussed below). The simulation can be performed at various speeds. In one embodiment, the simulation is performed at 60 Hz.

For each item in a region, the simulation server will store a checksum. The checksum is based on all (or in some cases less than all) the properties for that particular item. Examples of these properties include position, velocity, acceleration, rotation, rotational velocity, etc. In general, checksums are used to allow large blocks of data to be rapidly tested against each other for changes without having to test each individual piece of the data. Checksums can vary from simple sums of the binary data to more advanced techniques like CRC (which are less likely to produce the same checksum from different source data) and cryptographic, one-way checksums like MD5. One embodiment of the present invention uses simple summing checksums. That is, the binary data representing the properties of interest are summed to created a checksum. However, the technique of using checksums to compare data is not limited by the underlying means for generating the checksum. In another embodiment, the checksum is a count-up check-sum, where changes would increment a counter rather than changing a CRC.

All of the items in a particular grid are divided into three categories: agents, moving objects, and stationary objects (also called passive objects). Agents, which will be discussed below, correspond to users of the simulation system. Within each of those three categories, the various items are subdivided again into five subcategories based on the size, with the first category being the largest items, and the fifth subcategory being the smallest items. The checksums for all of the objects within a given subcategory are combined to form an aggregate checksum for that subcategory for the particular bin. Thus, each bin will have checksums for each object and fifteen aggregate checksums (five aggregate checksums for agents, five aggregate checksums for moving objects and five aggregate checksums for stationary objects). These checksums are used to determine which objects have changed.

Figure 8:
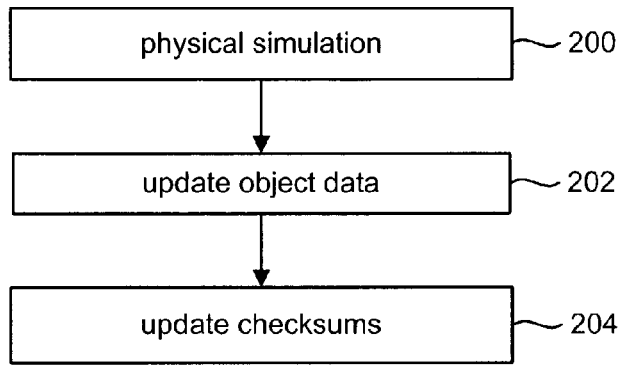
FIG. 8 is a flowchart describing the operation of one embodiment of a simulation server.

FIG. 8 is a flow chart describing one embodiment of a process performed by a simulation server. In step 200, a given simulation server performs the physical simulation for the region associated with the simulation server. This includes the physics simulation and continuum dynamics mentioned above. Step 200 includes determining how each object moves or changes in the region, collision analysis, and updating the layers such as weather, water, land movement, etc. Step 200 is performed using the simulation data for the region being simulated, which is stored by the simulation server. In step 202, the simulation server will update all the data for each of the objects that change. In step 204, checksums are updated for objects that have changed. In addition, one or more appropriate ones of the fifteen aggregate checksums are updated if there is a change.

It is contemplated that a simulation will continue for long and/or indefinite periods of time, during which users can join the simulation and leave (temporarily or permanently) the simulation. FIG. 9 provides a flowchart describing one embodiment of a process performed for a user joining the simulation. In step 250, viewer 102 requests version information from user server 134. In step 252, user server 134 sends the version information to viewer 102. The version information pertains to the version of the simulation server and viewer, and is used to verify compatibility. In step 254, viewer 102 sends a log-in message to user server 134. In step 256, user server 134 sends a log-in request to data server 132. Data server 132 authenticates the user based on the information in the log-in request. The log-in message sent from viewer 110 to user server 134 includes a username and password. Both the username and password are sent to Data Server 132.

Based on the username and password, and stored credential information in a database for data server 132 authenticates the user. Additionally, in step 258, data server 132 determines a set of possible initial locations in the simulation space to start the user. Data server 132 sends a message back to user server 134 indicating that the authentication was successful and the set of possible start locations. If the user had previously been involved in the simulation, one of the possible initial locations is the user's location when the user had stopped the previous simulation session. Alternatively, the user can be given the option of starting from a home location. If the user is a new user, the user may be provided with a default initial location. In other embodiments, other locations can also be provided to the user. In one embodiment, the user locations are coordinates in the simulation space.

In step 260, user server 134 sends a log-in confirmation message to viewer 102. This log-in confirmation, in addition to confirming that the user is properly logged in, indicates the set of possible initial locations. The initial locations will be depicted to the user via a graphical user interface or other interface. The user will select one those locations. In step 262, viewer 102 sends the location request to user server 134, indicating which location the user requests to start the simulation. In step 264, user server 134 sends the requested initial location to space server 130. In step 266, space server 130 determines which region of the simulation space the requested initial location resides in. Additionally, space server 130 determines which simulation server is responsible for simulating the region of the initial location. Space server 130 sends a reply to user server 134 indicating the region. In step 268, space server 130 creates a security code. In one embodiment, the security code is a randomly generated number. In another embodiment, the system creates a sequence of digits or letters which are used to provide a unique code. In step 270, space server 130 sends a message to the simulation server for the region that includes the initial location. This message indicates that the user will be contacting the simulation server to join the simulation. This message also includes the security code. In step 272, space server 130 sends a message to user server 134 which includes the security code, the IP address of the simulation server simulating the region with the initial location, and the port number for the simulation server. In step 274, user server 134 sends a message to viewer 102 with the security code. In step 276, user server 134 sends a message to viewer 102 with the IP address and port number for the simulation server.

In step 278, viewer 102 sends a message to the simulation server which includes the security code. The purpose of the security code is to tell the simulator to expect the connection requests from the viewer. This is for security purposes. Thus, a simulation server will not communicate simulation data to a viewer unless the viewer provides the security code which was previously sent to the simulation server from the space server. In step 280, viewer 102 sends a request message to join the simulation. The request, which is sent to the appropriate simulation server based on the IP address and port number received from user server 134, includes an identification of the user. In step 282, the simulation server sends a request to data server 132 for agent information. Each simulation server will create a software process called an agent for each user that is connected to the simulation server. The agent handles communication between the simulation server and the viewer. Within the simulation server, the agent is considered a representation of the viewer. In step 284, the simulation server receives the agent information from data server 132. That is, data server 132 finds all the information about the user including the user's physical traits and physical state, and sends that information to the simulation server. In step 286, the simulation server creates the agent process based on the information from step 284. In step 288, the agent performs a child-agent propagation, which will be discussed in more detail below. In step 290, the agent begins operation. In step 292, the simulation server sends an initialization complete message to viewer 102. In step 294, the user interacts with the simulation space using viewer 102.

Users who are interacting with the simulation space will be provided with a visual representation of the simulation space. The view can be from a first person point of view (e.g. from the user's perspective) or a third person point of view (e.g. from the perspective of a camera pointed at the simulation space). If the user is viewing the simulation space from a first person point of view, then the user will perceive those objects which fall within a particular field of view centered upon the user's location, and extending some distance from that user within some horizontal and vertical field of view. In the simulation space, the user's location is represented by the agent. The volume of space enclosed by the field of view from any given user is referred to as the "view frustum" for that user. An exact shape of the frustum may be modified depending on the nature of the form of the user. For some human users, the frustum may tend to be rectangular in vertical cross-section. The distance away from the object to which the frustum extends may be dependent upon the visual conditions being simulated; simulations of poor visual conditions (e.g., fog, snow, etc.) will tend to have a frustum which does not extend as far as simulations with clear visual conditions. Not every object is human and, because simulations include virtual reality, different forms of objects and beings can be imagined. Examples of frustum shapes include circles, semi-circles, pyramids, cones etc. In one embodiment, the frustum is in the shape of a keyhole, so that things in front of the user will be shown visually, and things behind the user and close to the user will be sensed (audio, tactile, etc.), although possibly not graphically depicted. In one embodiment, there can be separate frustums for audio and visual perception. The perception of an audio object can be a function of the volume of the source, the viewer's support for audio, and range from the source object. If the user is viewing the simulation space from a third person point of view, then the user will perceive objects that are within the view frustrum of a camera from which the user is viewing the simulation space. The camera can have many different shaped view frustrums, as listed above.

Figure 10A:
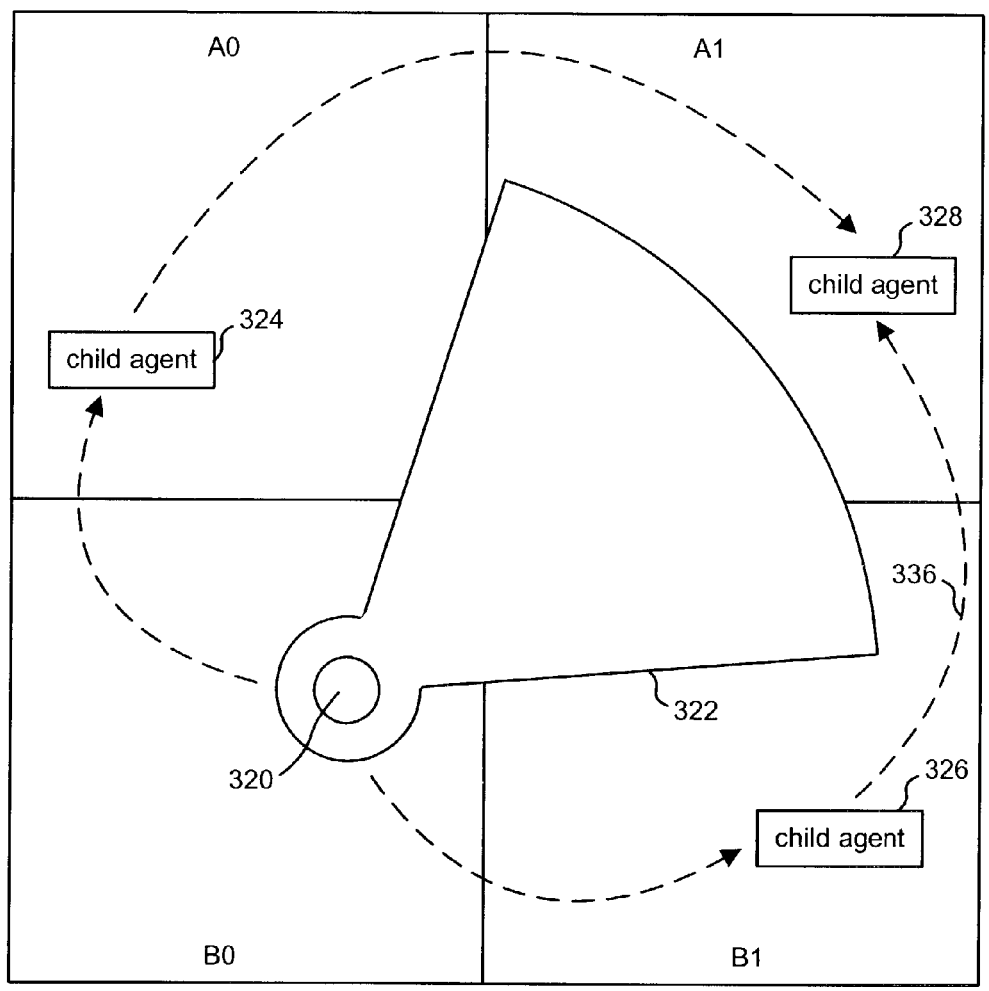
FIG. 10A graphically depicts four regions in a simulation space, illustrating the concept of an agent and child agents.

FIG. 10A shows four regions A0, A1, B0, and B1. Inside region B0 is the user represented by agent 320. Agent 320 has a view frustum 322 in the shape of a keyhole. While the user is in region B0, the user's viewer software will be in communication with simulation server 116 via agent 320. As can be seen from FIG. 10A, the user has a view frustum that overlaps onto regions A0, A1 and A2. One embodiment of the present invention includes creating child agents for a user on all the regions that the view frustum for that particular user overlaps. The process of creating these child agents is called "child agent propagation," referred to in step 288 of FIG. 9. Note that in one embodiment, a user can only perceive objects that are within the user's view frustum.

Figure 11:
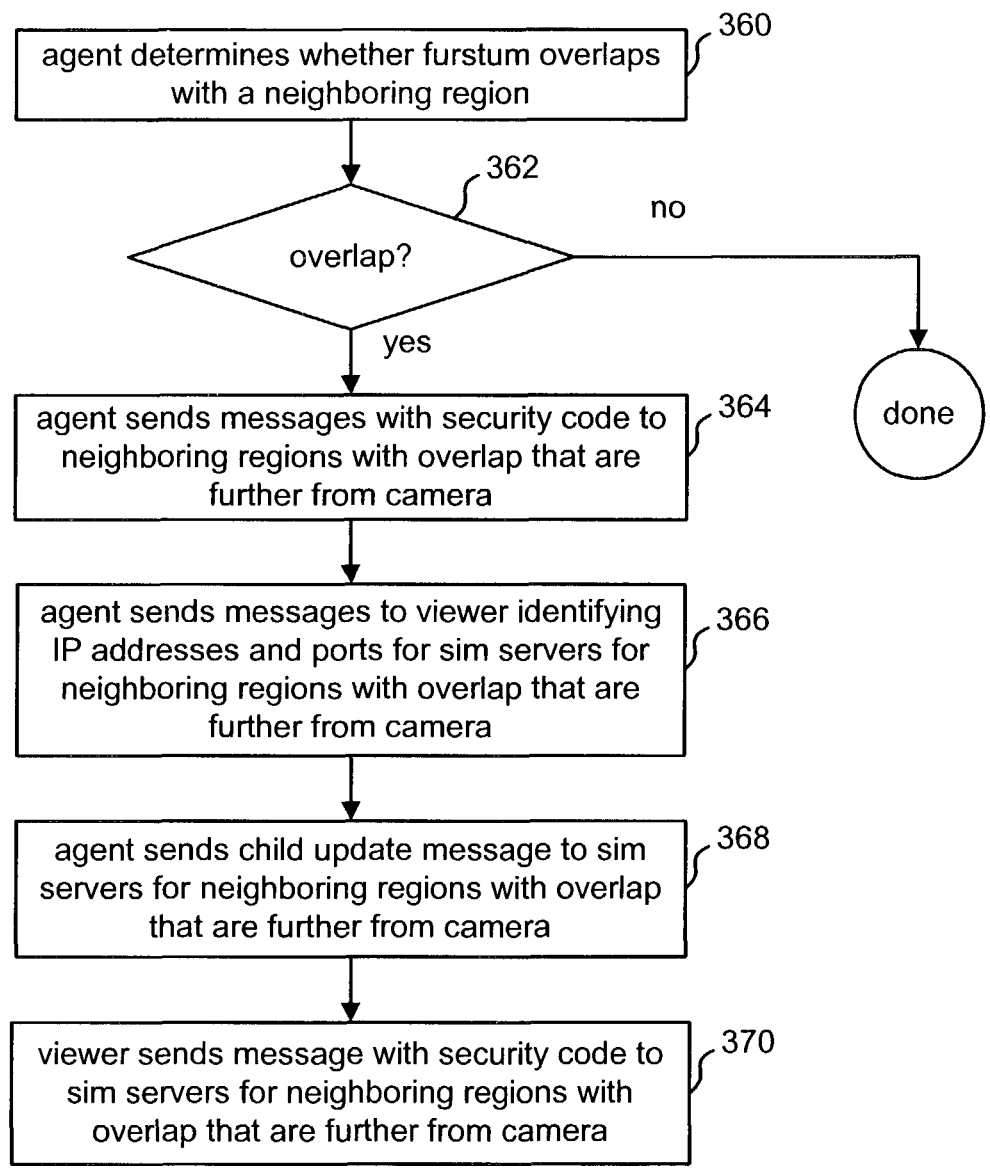
FIG. 11 is a flowchart describing one embodiment of a process for child agent propagation.

FIG. 11 is a flowchart describing the process for child agent propagation. In step 360, agent 320 determines whether the associated frustum 322 overlaps with a neighboring region. The neighboring regions for region B0 include A0, B1 and C0. If there is no overlap (step 362), then the process of FIG. 11 is completed. If there is overlap, then in step 364, agent 320 sends messages with a security code (some embodiments use a new security code, some embodiments use the previous security code for the user) to the neighboring regions with the overlap that are further from the camera. That is, only regions that are further from the camera will be sent the message. Note that each user is associated with a fictitious or virtual camera. It is from that camera that the view frustum is calculated from. In the embodiment shown on FIG. 10A, the user's point of view is first person and, therefore, the camera is co-located with the agent. In alternative embodiments, the user can be given a third person view, in which case the camera is separate from the agent, and in those cases the view frustum is calculated from the camera, not from the agent. For purposes of this example, it is assumed that the camera is co-located with the agent. In the example of FIG. 10A, agent 320 will send the messages to simulation servers 110 and 118. In step 366, agent 320 sends messages to viewer 102 identifying the IP addresses and port numbers for simulation servers for the neighboring regions which overlap and that are further from the camera (e.g. the IP addresses for simulation servers 110 and 118). In step 368, agent 320 sends child update messages to each simulation server for the neighboring regions with overlap and that are further from the camera. The child update message provides information about the agent including physical properties of the user such as position, velocity, direction of pointing, rotation, rotational velocity, acceleration, textures, audio, animation state, camera information, (eye position, direction, aspect ratio, field of view, . . . ), etc. In step 370, viewer 102 sends a message with the security code to the simulation servers for the neighboring regions with overlap that are further from the camera. For example, viewer 102 would send a message to simulation server for A0 and simulation server for B1 with the same security code that was sent with the message in step 364. The security code provides security measures so that the simulation servers know to communicate with viewer 102.

Figure 12:
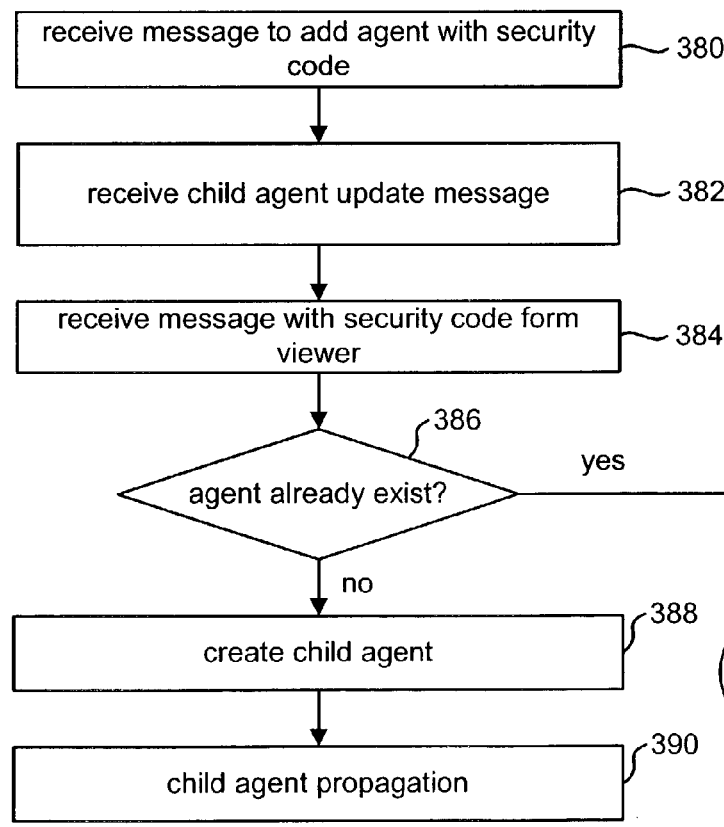
FIG. 12 is a flowchart describing one embodiment of a process performed by a child agent during the propagation process.

FIG. 12 is a flowchart describing the process performed by the neighboring simulation servers in response to the process of FIG. 11. For example, the process of FIG. 11 would be performed by simulation servers simulating regions A0 and B1. In step 380, the simulation server receives a message to add the new child agent with the security code. In step 382, the simulation server receives the child update message. In step 384, the simulation server receives a message with a security code from the viewer. If the agent already exists (step 386), then no further steps need to be performed for initializing the child agent. If the child agent does not already exist, then in step 388 the child agent is created based on the information received above. In step 390, that child agent will perform the child agent propagation process of FIG. 11. After a child agent is created, agent 320 will continue to send child update messages.

Looking back at FIG. 10A, agent 320 is depicted by dashed lines as creating or propagating child agent 324 in region A0 and child agent 326 in region B1. Child agent 324 then propagates child agent 328 in region A1, also illustrated by a dashed line. Similarly, child agent 326, using the process of FIGS. 11 and 12 also tries to propagate child agent 328. However, due to step 386, child agent 328 was already created and is not created a second time.

Figure 10B:
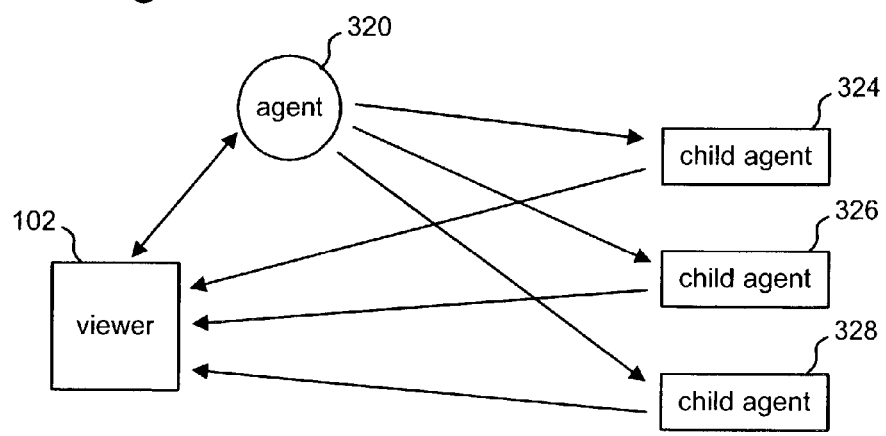
FIG. 10B illustrates communication between a viewer, an agent and child agents.

FIG. 10B depicts how the various agents communicate with viewer 102. Viewer 102 is in bi-directional communication with agent 320 regarding simulation data in region B0. Viewer 102 provides commands to agent 320 in regard to how the user wants to move and act, and agent 320 provides information about region B0 back to viewer 102. Agent 320 communicates information about its position and properties described above to each of the child agents 324, 326, and 328 using child update messages. Child agent 324 provides information to viewer 102 about objects in frustum 320 and region A0. Child agent 326 provides information to viewer 102 about objects in region B1 and frustum 322. Child agent 328 provides information about objects in region A1 and frustum 322. Thus, via the graphical user interface on the user's computing device, the user will see objects that could possibly be in regions B0, A0, A1, and B1. As can be seen from the above discussion, a simulation server will communicate (via its agents) with users (e.g. viewers) who can perceive objects in its region and, in some embodiments, will not communicate with users who cannot perceive objects in its region.

Figure 13:
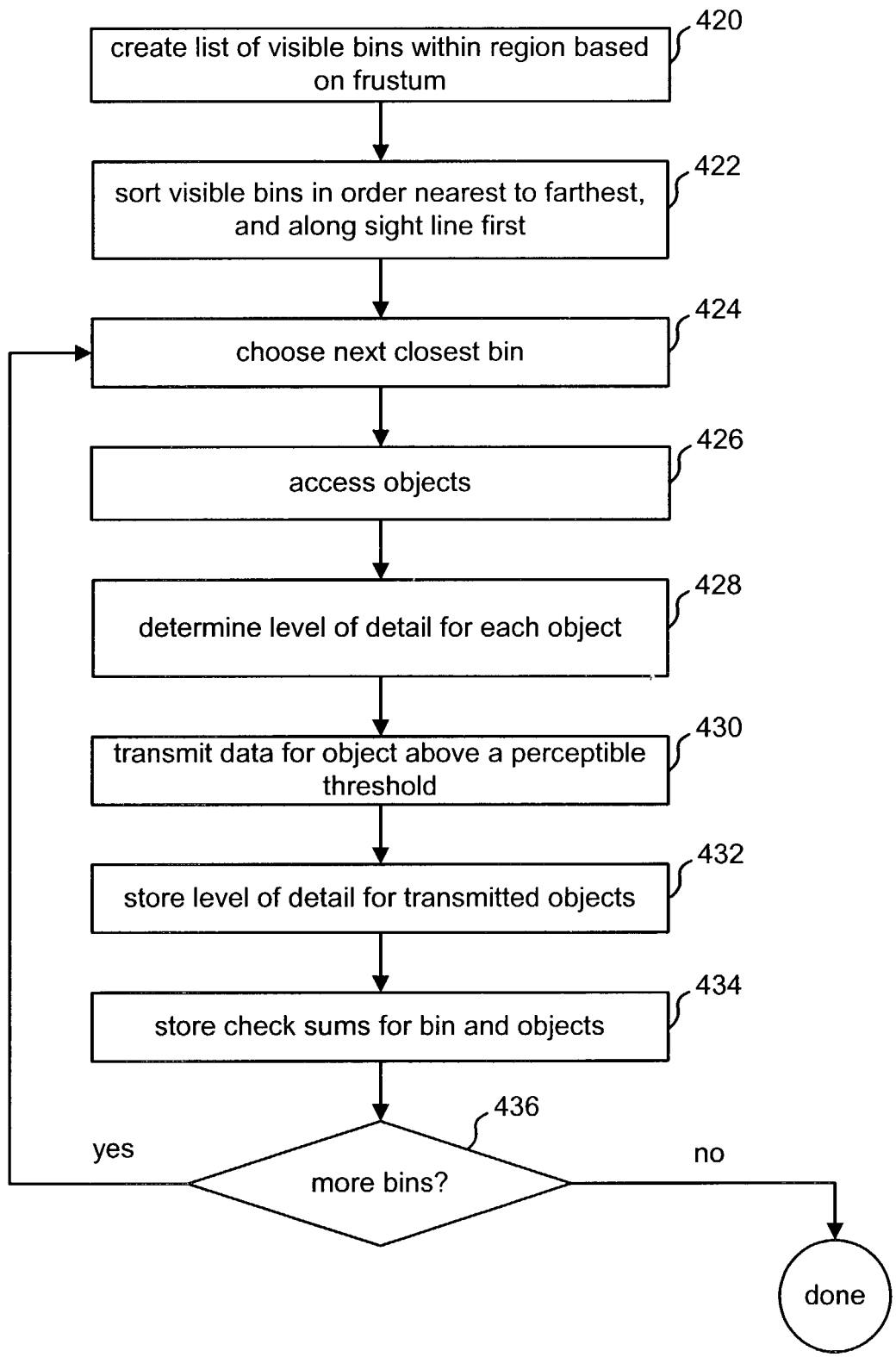
FIG. 13 is a flowchart describing one embodiment of the process for agent initialization.

FIG. 13 is a flowchart describing the process of commencing operation of an agent, which is performed during step 290 of FIG. 9. In step 420 of FIG. 13, the agent creates a list of visible bins within the frustum and region for that agent. For example, looking back at FIG. 10A, agent 320 would determine all bins in region B0 that are within the frustum 322. Note that the steps in FIG. 13 would be performed by the child agents as well. Thus, child agent 324 would determine all bins in region A0 that are within frustum 322. In step 422 of FIG. 13, the bins are sorted in order from nearest to farthest and along the sightline first. In some embodiments, the sightline would be from agent 320 through the center of frustum 322. In other embodiments, sorting can be done in a different order and may not necessarily use the sightline. In step 424, the system chooses the next closest bin. If it is the first bin being chosen (the first time step 424 is performed in the process), then the closest bin to agent 320 is chosen. In step 426, agent 320 accesses each object in the bin. In step 428, the agent determines the level of detail for each object. Some objects may store information at the level of detail that they want to be perceived. Some users may include information in a user profile for the level of detail for different objects. In a some embodiments, the level of detail will be proportional to the distance from the agent (or from the camera). Thus, objects that are closest to the camera will have high detail and objects that are furthest from the camera will have low detail.

In step 430, agent 320 will transmit data to viewer 102 for every object that is above a perceptible threshold. Some users will provide information about vision perception. For example, a particular user could have bad vision or health problems. Based on the type of form that the user is taking in the simulation space the vision may vary. For example, a human may not necessarily have as good a vision as other animals. A user can also be a machine in the simulation space which has better vision than a human. Based on the vision of the user, the level of detail, and the distance from the user to the object, the system determines which objects are perceptible by the user and which are not. Note that the only objects that are within frustum 322 are considered. Because of the amount of data sent to the viewer could be large, the data is compressed. More detail about the compression will be discussed below. In step 432, agent 320 stores the level of detail for each of the transmitted objects. In step 434, agent 320 stores the checksums for each of the transmitted objects. Remember that each bin has 15 checksums associated with it, including five subcategories for moving objects, five subcategories for stationary objects, and five subcategories for agents. In step 436, agent 320 determines whether there are any more bins in the frustum within the region that need to be considered. If not, the process of FIG. 13 is completed. If there are more bins in the frustum within the current region, then the process loops back to step 424 and the next closest bin is chosen and evaluated using steps 426 to 434.

The raw data representing the instantaneous state of the simulation space within the perception of the user is significantly larger than the bandwidth required to transmit to a user. To achieve real time performance, this data must be compressed. Lossy media compression techniques (in which the decompressed information differs from the original) like those used in audio and video applications are examples of mathematical algorithms which achieve these high levels of compression. Lossy compression works by preferentially omitting information which is algorithmically determined to be perceptually invisible to the end user. For example, the presence of certain pitch ranges within pieces of music can be shown to 'mask' or conceal other pitch ranges which may be present. A lossy compression can take advantage of this by removing the masked data from the transmitted data, thus reducing bandwidth. In the case of the simulation system, the system minimizes the data to be transmitted, as described above. Then this data is transmitted using a lossy compression. One example of a lossy compression is JPEG compression. Other types of lossy compression can also be used. With a JPEG compression, as well as other lossy compression, the amount of compression can be varied from minimal compression to heavy compression. Large amounts of compression make the data smaller, but lose more data. Small amounts of compression keep the data larger, but maintain the final result much closer to the start than a heavy compression. In one embodiment, the system varies the amount of compression. For example, objects that are closer to the camera use less compression, while objects further from the camera use more compression. By varying the compression, objects that are closer will arrive to the viewer with more detail, while objects that are further may lose some detail. It is acceptable to lose some detail in objects that are further from the viewer because typical viewers will not be able to see things clearly that are far away. Thus, the greater the distance from the camera or agent, the greater the amount of compression. Viewer 102 will include software or hardware for decompressing the data.

Figure 14:
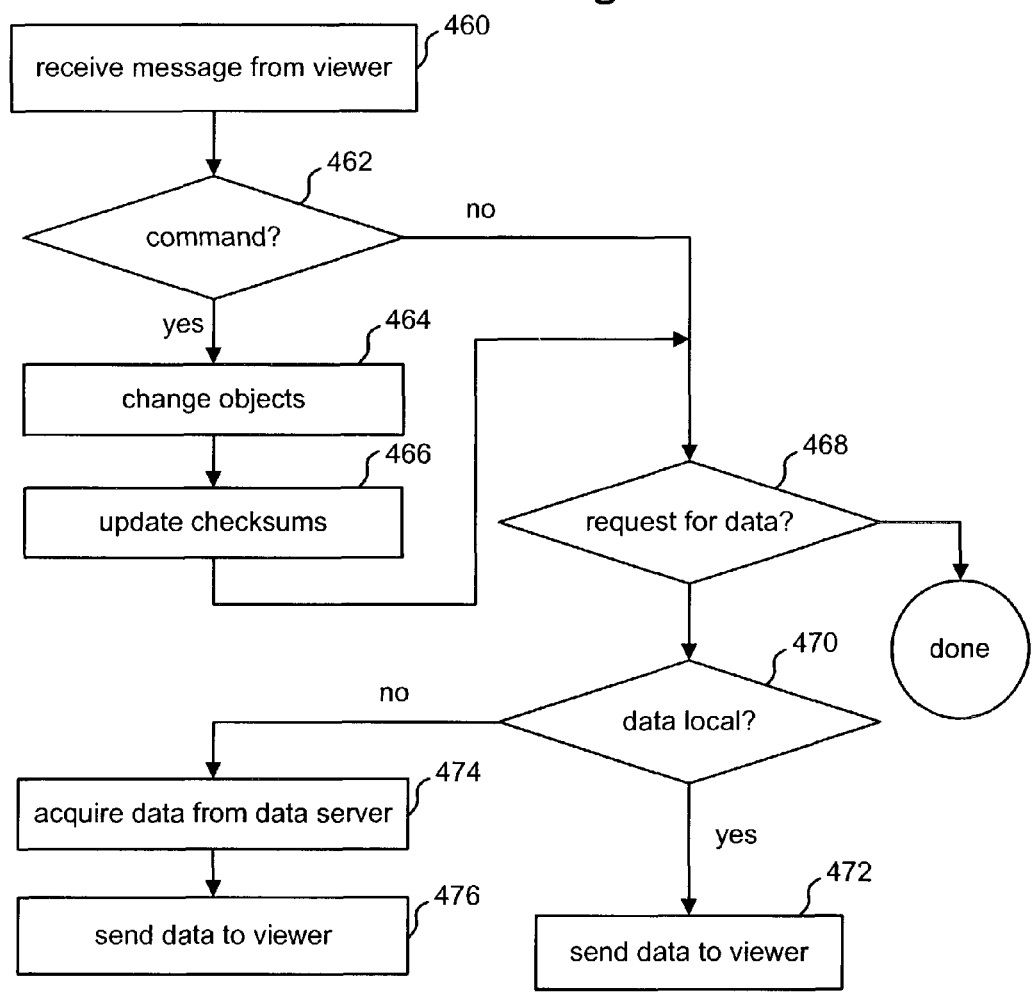
FIG. 14 is a flowchart describing one embodiment of a process for an agent responding to a message from a viewer.

Viewer 102 includes software for providing a user interface to the user. This user interface provides a view into simulation space. Additionally, the user interface provides ability for the user to perform operations or issue commands. These commands can include moving, rotating, selecting, grabbing or performing an action on an object or other user. When a user issues a command, a message with the command is sent to the agent. FIG. 14 is a flowchart describing a process which the agent performs in response to a message from a viewer. In step 460, the agent receives the message from the viewer. In step 462, it is determined whether that message includes a command. Most messages will include a command or a request for data. If the message includes a command (step 462), then objects will be changed by the agent in response to the command. For example, if the command includes moving an object, the data for that object will be changed to reflect the object movement. In step 466, the checksum for all objects that are changed are updated. In addition, any affected aggregate checksums are updated. In step 468, the system determines whether the message also included a request for data. If, in step 462, it was determined that message did not include a command, then the method loops directly from step 462 to step 468. In step 468, the agent determines whether the message includes a request for data. If the message does not include a request for data, then the process of FIG. 14 is completed. If the message includes a request for data, then in step 470 the agent determines whether the data is local. If the data is local to the agent (e.g., within the simulation server), then that data is sent to the viewer in step 472. If the data is not local (step 470), then that data is acquired by the agent from data server 132 in step 474 and sent to the viewer in step 476 as described herein.

Figure 15:
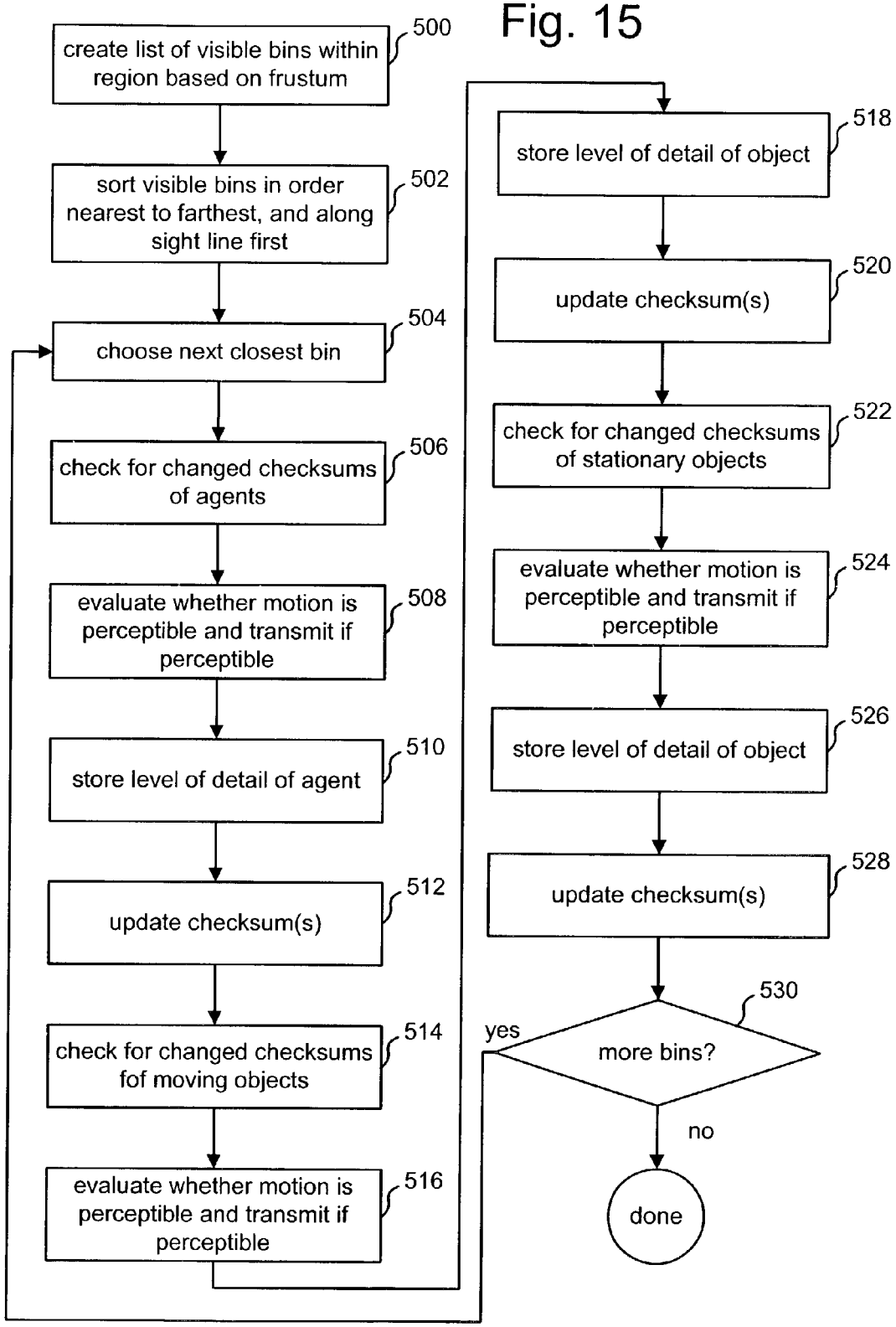
FIG. 15 is a flowchart describing one embodiment of a process performed by an agent providing data to a viewer.

In addition to responding to commands or requests for data from a viewer, an agent process will perform a reporting function. In one embodiment, the reporting function is performed at a rate of 20 Hz. FIG. 15 is a flowchart describing the process of that reporting function. In step 500, the agent creates a list of all visible bins, which are bins within the region and in the frustum. For example, looking at FIG. 10A, agent 320 will look in frustum 322 to determine all bins in region B0 that are in frustum 322. In step 502, the bins are sorted in order nearest to farthest, and along the sightline first. In step 504, the next closet bin is chosen. In step 506, the five aggregate checksums for agents are checked to see if any changed since the last check. Remember that each bin has three sets of checksums, one set of five for agents, one set of five for moving objects, and one set of five for stationary objects. The agent previously stored all the checksums for all the bins within its frustum. Step 506 checks the checksums for all five subcategories for the agents (other users) in the bin. If the aggregate checksum for a subcategory has not changed, it is assumed that all of the items in that subcategory have not changed. If the aggregate checksum of a subcategory has changed, then the agent will look at the checksums for all of the objects for that subcategory to determine which checksums have changed. A change in the checksum indicates that the associated item has also changed. In step 508, the agent evaluates whether the change (for each item that has changed) is perceptible (e.g. based on distance from the user and its size). If the movement is perceptible, then the information about the object is transmitted by being compressed as described above.

Objects in the simulation space will optionally maintain multiple copies of themselves, corresponding to representations at various levels of detail. The agent will select a level of detail appropriate to the object's visibility to the viewer. When a given level of detail is transmitted, the agent will store the level of detail sent to the viewer. On subsequent passes through the objects, the agent will compare currently transmitted level of detail to new visibility (as the agent moves), and transmit appropriate new level of detail for the new visibilities. For example, an agent may teleport to a region and be in close proximity to an object. The transmitted representation of that object will therefore be at a high level of detail. Subsequently, the agent may move to a point more distant in the region, and the agent will still need to transmit the lower level of detail representation to the viewer. In one embodiment, for optimal performance, it may make sense for level of detail updating to be done by having the agent walk through its list of transmitted objects, checking for needed level of detail updates. This iteration can be done lazily, as level of detail information can be assumed to change slowly (proportional to user plus object velocity).

In step 512, the checksum stored by the user agent is updated. In step 514, the agent checks the aggregate checksums for moving objects, to determine any change. This includes looking at five checksums. If any of the checksums have changed, then the agent looks within the appropriate subcategory for the objects that have changed. If an object's checksum has changed, then the agent knows the object has changed. In step 516, the agent determines whether the change is perceptible based on its distance from the user and its size. If the movement is perceptible, then the information about the object is transmitted by being compressed as described above. The level of detail for the object is stored in step 518. The checksum stored by the user agent is updated in step 520. Note that steps 516-520 are performed for each item that has changed. In step 522, the user agent checks the aggregate checksums for stationary objects to determine which have changed. For example, a stationary object may rotate, while staying at the same location. If any subcategory checksum is changed, the agent looks at all the checksums within that subcategory for all the objects. For all the objects that have checksums that have changed, the user agent determines whether that particular object is perceptible based on its size and distance from the agent. If the object is perceptible, then its data is transferred in step 524 by being compressed as described. In step 526, the levels of detail for the transmitted objects are stored. In step 528, the checksums stored by the user agents for all moving objects are updated. In step 530, the agent determines whether there are any more bins to consider. If there are no more bins to consider, the process of FIG. 15 is completed. If there are more bins to consider, then the process loops back to step 504 and repeats the steps for the new bins.

Figure 16:
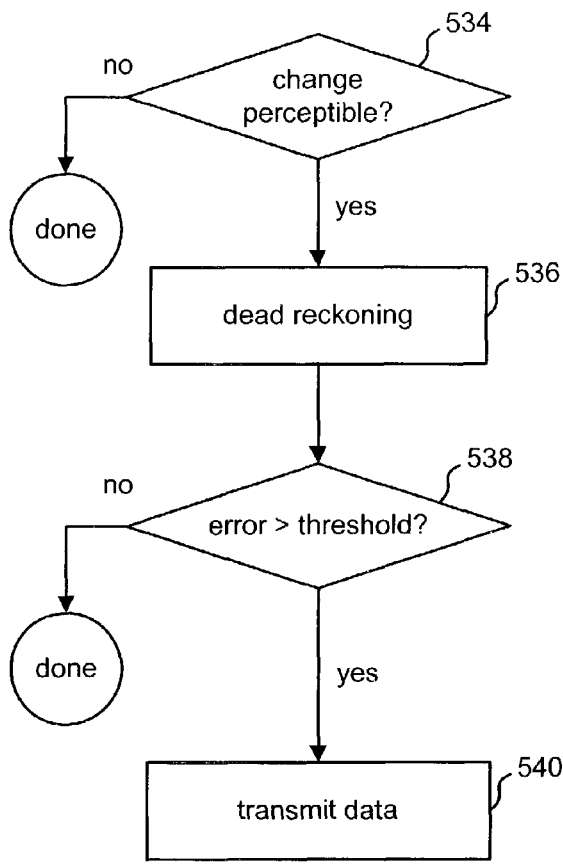
FIG. 16 is a flow chart describing one embodiment for transmitting data to the viewer.

Steps 508, 516 and 524 of FIG. 15 include transmitting data about objects to a viewer. For dense and dynamic scenes, these transitions would rapidly utilize all available bandwidth; therefore, some embodiments use various techniques for limiting the data transmitted. One example of a method for limiting the amount of data transmitted about the changes regarding objects uses dead reckoning technology. FIG. 16 depicts a flow chart which describes one embodiment for steps 508, 516 and 524 that uses dead reckoning to limit the amount of data transmitted about the movement of objects. In step 534, the agent determines whether the change in the object is perceptible. There are various ways for determining perceptibility. In one embodiment, the perceptibility test determines whether the movement would be visible as a more than one pixel shift in the user's display, or appropriately expanded to a larger set of pixels as bandwidth/conditions dictate. The simulator can be informed of the viewer's conditions (e.g. screen resolution), and determines whether the motion (or other change), relative to the vantage point of the viewer, would be both within the view frustum and potentially larger than one pixel. In another embodiment, the agent determines the distance from the moving item to the current user's agent. The item's size is also taken into account. For example, large items can be perceived anywhere in the frustum, very small items can only be seen when closest to the agent in the frustum, etc. In other embodiments, the agent could consider size, transparency, whether the item is a light source, dynamic behavior (such as moving texture) and whether the object is moving (moving objects are more perceptible than stationary objects). If the change in the object is not perceptible, then the process of FIG. 16 is finished. If the change in the object is perceptible, the a dead reckoning analysis is performed in step 536.

One embodiment of the present invention utilizes a combination of first and second order dead reckoning to approximate the position of moving objects in the scene. Dead reckoning refers to the process of predicting the current position and orientation of an object based on time, and previous positions, previous orientations, previous velocities, and, for second order, previous accelerations.

For linear motion, second order dead reckoning is used:

$$P1=P0+((V+0.5*dt)*A)*dt$$

Where:
P1 is the predicted position
P0 is the last known position
V is the last known velocity
A is the last known acceleration
dt is the time since the last known position
For orientation, first order dead reckoning is used:

$$R1=R0+V*dt$$

Where:

R1 is the predicted orientation

R0 is the last known orientation

V is the last known rotational velocity dt is time since the last known orientation Dead reckoning is used on the viewer to compute smooth motion with periodic updates. On the simulator, dead reckoning is used to determine whether an update needs to be sent to the viewer. Updates need to be sent when the error on the user's display would exceed a given pixel threshold. For example, consider:

$$E = P1 - Pa$$

$$PE = 2.0 * A\ TAN\ 2(E,D) * HP/FOV$$

If($PE > \epsilon$) send new update

Where:

E is absolute error between predicted position and actual position

P1 is the predicted position

Pa is the actual position

PE is the pixel error on the user's screen

A TAN 2 is the trigonometric function arctangent of E divided by D

D is the distance from the viewer to the object

HP is the viewer's window height in pixels

FOV is the viewer's field of view $\epsilon$ is the pixel threshold (e.g. 1 pixel)

In step 538, it is determined whether the pixel error PE is greater than the pixel threshold $\epsilon$. If so, the data about the object is transmitted to the viewer in step 540. If the pixel error PE is not greater than the pixel threshold $\epsilon$, then the data is not transmitted to the viewer.

In one embodiment, decimation is also performed. Objects further away from the viewer take up less screen space due to perspective effects, so less precision is required to transmit their position and orientation. Simulators can transmit position and orientation as full 32-bit floating point numbers, as unsigned 16-bit fixed point number, or as unsigned 8-bit fixed point numbers. The error for reducing precision may be determined as follows:

$$E = k * S * MAX$$

$$PE = 2.0 * A\ TAN\ 2(E,D) * HP/FOV$$

If($PE < \epsilon$) can use reduced precision value

Where:

E is the absolute error between the 32-bit floating point representation and the reduced precision substitute k is a constant to allow for values slightly outside the normal range S is the edge length of the simulator's region MAX is the largest number that can be represented by the reduced precision substitute (65535 for 16-bit, 255 for 8-bit)

PE is the pixel error on the user's screen

A TAN 2 is the trigonometric function arctangent of E divided by D

D is the distance from the viewer to the object

HP is the viewer's window height in pixels

FOV is the viewer's field of view $\epsilon$ is the pixel threshold that allows the reduced precision value to be used For each object, eight and sixteen bit options are tested and if they are below the pixel threshold, the reduced precision value is used.

Textures are image data that are applied to polygons (or other shapes/objects) in three dimensional rendering. In the simulation system of the present invention, textures are used to add image information to objects. In one embodiment, when an agent sends data for an object, the agent does not initially send audio data or texture data. This is because the audio data and texture data can be very large. Whenever audio data and texture data is sent, the viewer will cache the data for future use. The agent will send the object information with a path or pointer to the texture or audio data. If the viewer already has the texture or audio data, then the viewer uses the cached version. If the viewer does not have the texture or audio data, then the viewer will request that the texture data be transmitted from to the viewer.

Prior to transmission, textures are compressed using a lossy compression scheme (e.g. using the JPEG2000 compression standard) that supports progressive transmission and decompression of the texture (image) data. Progressive transmission means that the amount of data sent for an image determines what resolution of the image can be decompressed and reconstructed. Thus, for images that are far away, a very small amount of data is sent and decompressed into a low resolution image. As the user/agent approaches the image, more data is sent and higher resolution images are constructed. This is especially useful for three dimensional rendering since in order to prevent texture aliasing, a well known technique called mipmapping is used. Mipmapping uses textures of lower resolutions (generally power of 2 drops) to texture polygons that are further away from the observer.

When a texture is first transmitted to a viewer, the lowest resolution version of the image is sent. Over time, if requested, additional data for that texture/image is sent. The additional data is used to decode a higher resolution version of the image. The more data the viewer has, the greater the resolution of the decoded image. In one embodiment, each transmission of image data will only transmit the amount of data needed to decode the image to the currently desired resolution.

Figure 17:
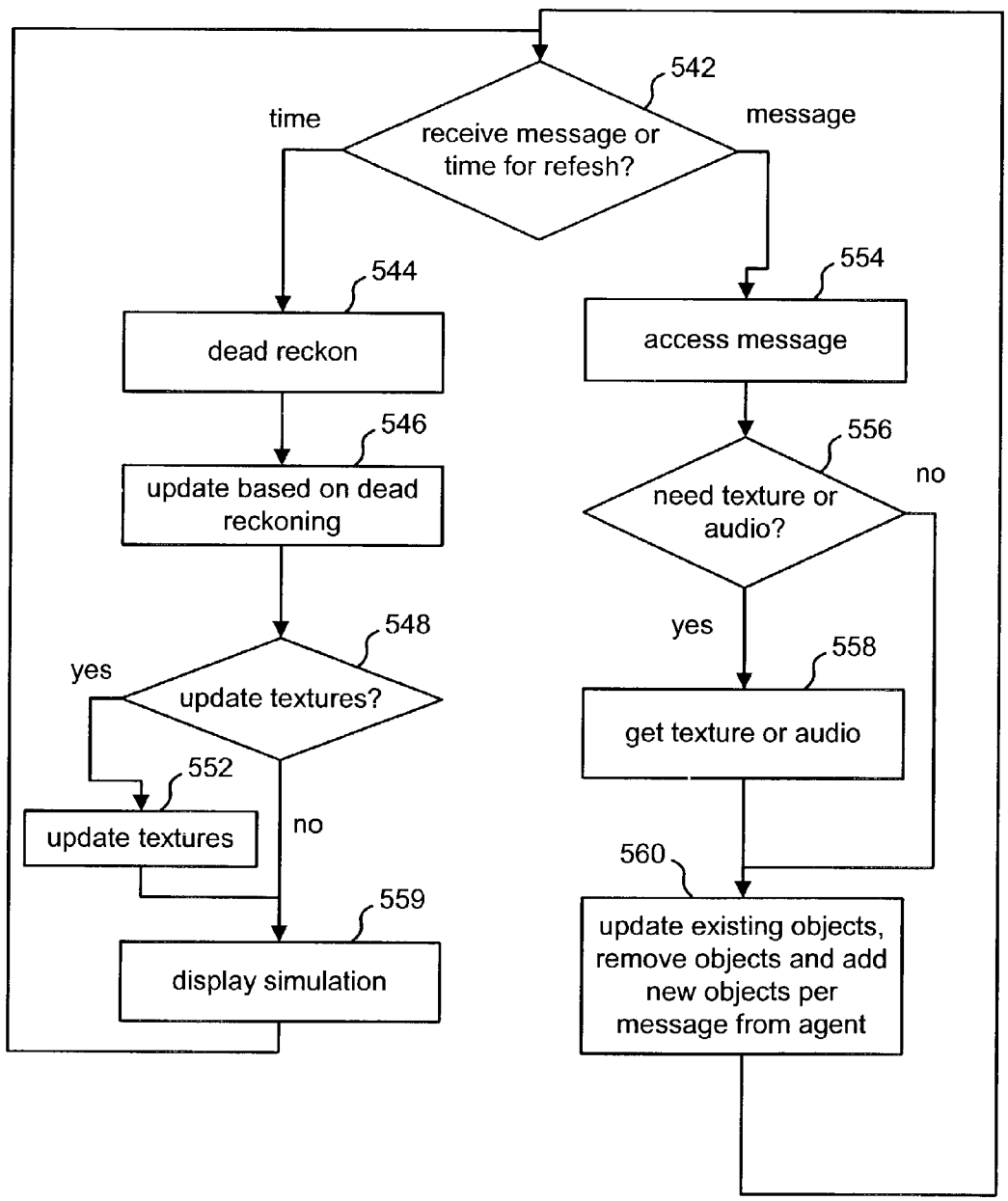
FIG. 17 is a flowchart describing one embodiment of a process performed on the viewer for updating and displaying information.

FIG. 17 describes a process for receiving information at the viewer and updating the simulation at the viewer. The viewer will update the display to the user according to a refresh rate that is dependent on the viewer's hardware. Examples of refresh rates are 20 to 60 frames per second; however, other refresh rates can also be used. In between refreshes, the viewer may or may not receive updated data for the objects in view, as described above. If no new data is received from the agent, then (in step 542) the process will wait for the next refresh. When it is time to refresh the display, the viewer will perform the dead reckoning in step 544, as described above, on the objects in view. In step 546, the data for the relevant objects will be updated based on the dead reckoning of step 544. In step 548, the process will determine whether it needs to update the textures. There are many suitable tests for determining whether to update the textures. In one embodiment, the textures are updated once every sixteen frames. Thus, step 548 tests to see if the textures have been updated within the last sixteen frames. Other tests can also be used. The test used is not a constraint on the present invention. If it is determined that the textures should be updated, then the textures are updated in step 552. After the textures are updated, or if the textures are not to be updated, the updated simulation environment is displayed to the user in step 559. The updated simulation environment is a three dimensional environment that depicts the objects and textures whose data has been transmitted to the viewer. As described above, the various textures are displayed at different resolutions.

If a message is received from the agent (see step 542 of FIG. 17), then the message is accessed in step 554. The message may contain a path or pointer to a texture. If so, a texture is needed (step 556) and that texture is fetched in step 558. If no texture is needed, or after the texture(s) is/are fetched, information about objects stored in the viewer are updated, objects that are removed from the viewer's point of view are removed from the viewer's data and objects that came into the point of view are added to the data to be displayed, all per the message from the agent. After step 560, the method loops back to step 542 and waits until it is time to refresh the display. It may be that at the completion of step 560 it is time to refresh the display so the process does not need to wait (or waits a short time) for the next refresh.

Figure 17A:
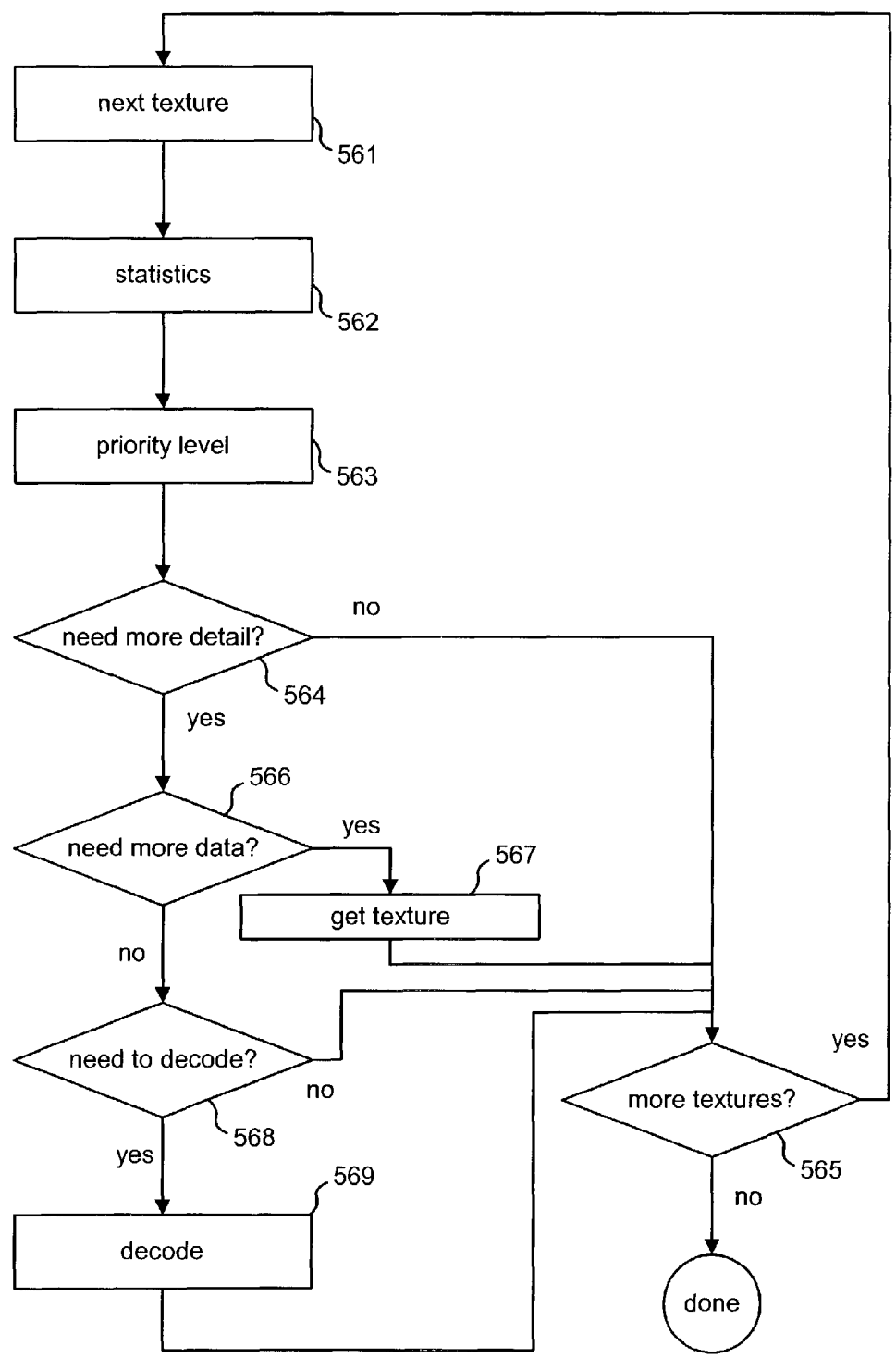
FIG. 17A is a flowchart describing one embodiment of a process for updating textures

FIG. 17A is a flow chart that describes the process for updating the textures displayed on the viewer. In step 561, the next texture to be considered is accessed. If this is the first time that step 561 is being performed for the current iteration of the process of FIG. 17A, then the first texture is accessed. In step 562, one or more statistics about the texture are determined. In one embodiment, step 562 includes determining a Pixel Area for the textures. The Pixel Area is defined as the area of the display in pixels occupied by the largest instance of the texture if the texture was not occluded. That is if the texture would appear to be 100 pixels by 50 pixels, but half of the texture is blocked by another object, the Pixel Area=100 pixels×50 pixels×2=1000 pixels. The Pixel Area is used to determine the resolution of the image that will be displayed. Thus, in one embodiment, determining the pixel area is the step used to determine resolution. In other embodiments, additional or other information can also be used. For example, the dimensions (in pixels) of the viewer display, the complexity of the texture, colors, user preferences, etc. can also be taken into account.

In step 563, a priority level is determined for the texture. The priority level is equal to: Priority Level=(Pixel Area/Bytes Already Sent)−2. Because of the (−2), an image for which more than 1 byte per two pixels has been sent will have a priority that is less than zero. In step 564, the viewer determines whether more detail is needed for the texture. That is, the viewer determines whether it needs a higher resolution image. As explained above, when the texture is first downloaded, the lowest resolution version of the texture is downloaded. If the texture is far from the agent in the environment, the low resolution images is sufficient. As the agent gets closer to the object with the texture, a higher resolution image is needed. Step 564 includes a test of whether the viewer needs to get a higher resolution image. One example of a suitable test is to determine whether the Pixel Area has changed by 50% since the last time the Pixel Area was calculated. Thus, the first time the process of FIG. 17A is performed, the Pixel Area of a particular image may be at a first value, which causes the image to be displayed at a first resolution based on sufficient data for that first resolution being downloaded. The second time the process of FIG. 17A is performed, the Pixel Area of a particular image may be at a second value which is larger than the first value, which causes the image to be subsequently displayed at a second resolution.

If it is determined that a higher resolution image is not needed, the process determines whether there are more textures to consider in step 565. If it is determined that a higher resolution image is needed, then the process determines whether more data is needed in step 566. It is possible that the more data for the higher resolution image is already stored locally; therefore, more data is not needed and the process determines in step 568 whether the higher resolution image needs to be decoded. If so, the higher resolution image is decoded in step 569 and the process continues with step 565. If, in step 568, it is determined that the higher resolution image need not be decoded (e.g. because it is already decoded), then the process continues with step 565. If, in step 566, it was determined that more data is needed (e.g. it is not already stored locally), then the additional texture data is fetched in step 567 the process continues with step 565. Note that as part of step 567, the viewer will communicate the Pixel Area and Bytes Already Sent to the Agent so that the Agent knows how much data to send. The viewer decodes the higher resolution image based on the previous set of image data and the additional data. The amount of additional data is determined by how many bytes are needed to set the Priority Level to less than zero. Thus, the greater the Pixel Area, the more data will be transmitted to the viewer and the higher the resolution of the texture image.

FIG. 17B is a flow chart describing the process for fetching texture data or audio data. In step 570 the viewer checks to see if that data is stored in its memory. If the data is in memory, then the process of FIG. 17B is completed. If the data is not in memory, then the viewer will check its local disk in step 574. If the data is in its local disk (step 576), then the data is stored in the viewer's memory in step 578 and the process of FIG. 17B is completed. In some embodiments, the process of 17B need not check local memory or disk if they were previously checked. If the data is not in the local disk, then the viewer sends a request to the agent in step 580. The agent checks its memory in step 582. If the data is in the memory for the agent (step 584), then data is transferred to the viewer in step 586, and the process continues in step 578. If the data is not in the memory for the agent, then the agent checks its disk in step 588. If the data is in the agent's disk, then the data is stored in the memory for the agent (e.g. the simulation server's memory) in step 592 and the process continues at step 586. If the data is not in the agent's disk, then the process continues at step 600 and the agent sends a request to the data server. The data server retrieves the data from storage in step 602. The data server sends the data to the agent in step 604. The agent stores the data in its memory in step 606. The agent sends the data to the viewer in step 608 and the viewer stores the data in its memory in step 578. In some embodiments, data provided to the user can be non-visual such as force feedback, tactile information, etc.

Steps 586 and 608 above include the agent sending texture data to the viewer. In one embodiment, the agent will have a set of one or more textures to be transmitted. All pending texture transfers are prioritized to maximize the visible improvement for the next packet of image data sent. Packets are then sent to the viewer in order of maximum priority until available texture bandwidth is used up. As described above, the viewer gathers statistics on Pixel Area and Bytes Already Sent and send that information to the Agent. The agent determines priority based on the Priority Level described above. The agent will send data for the texture having the highest priority. Once it starts sending data for that texture, it will continue until the priority for that texture is less than zero. This attempts to ensure that the image which looks the worst on the viewer is the first to be improved and that the viewer does not get more data than it needs. If a texture has a priority of less than zero, no additional data is sent until the priority to changes to a positive number. This means that the highest resolution image, using the above exemplar equation, is based on a 8:1 compression. In one embodiment, the lowest resolution is based on 100:1 compression.

When the viewer receives data for textures, the viewer will decode the texture image. Based on the amount of data it has, the viewer will decode to he best resolution it can. Because the simulation environment is likely to have many objects with many textures, the viewer is likely to need to decode multiple images. The viewer will decode images according to the Priority Level, with the image with the highest Priority Level being decoded first.

In one embodiment, rather than decode images at the exact desired resolution, the viewer will only decode at predetermined levels in order to improve efficiency. For example, one implementation may only allow images to be decoded to image sizes where the length and width are powers of two. In one implementation, the viewer will only decode to image sizes of 2×2, 4×4, 8×8, 16×16, 32×32, etc. In other embodiments, the image does not have to be a square, but the length and width should still be a power of two. When decoding, the viewer knows the actual image size and can round off to the nearest power of two or truncate to the next lowest power of two. For example, if the actual image size is 36×36 pixels, the viewer may decode to a resolution for a 32×32 image. In one embodiment, the viewer chooses the highest level that it has data for. In some embodiments, the viewer chooses the highest level that offers a minimum of 1 byte/2 pixels, or the nearest available level if the desired level is unavailable. Levels can be unavailable because sufficient data hasn't yet arrived (e.g. in some embodiments the viewer will not decode levels for which insufficient data is present), or because the data is there but a decoded version isn't yet available. Decoded levels that are not in use are stored in an in-memory cache, and are thrown out in LRU order as the cache size is exceeded.

Because the simulation is performed in real time, the processes of FIGS. 17, 17A and 17B must also be performed in real time.

Figure 18:
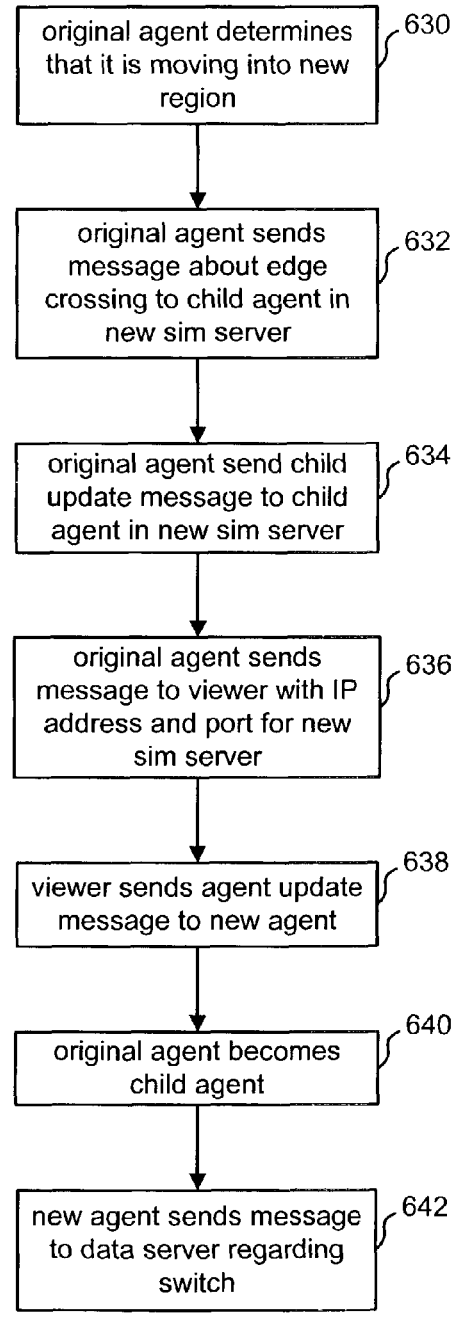
FIG. 18 is a flowchart describing one embodiment of a process performed when an agent crosses from one region to another.

During a simulation, as described above, a user can perform various actions including moving. As the user moves, the user's agent location in the simulation space moves respectively. Also as discussed above, while the simulation space is divided into a number of regions, these regions provide a continuous and contiguous simulation space so the user is not aware of the regions. Thus, users are free to move from region to region with no knowledge that a region boundary is being crossed FIG. 18 is a flowchart describing the process performed when an agent crosses from one region to another.

Figure 19A:
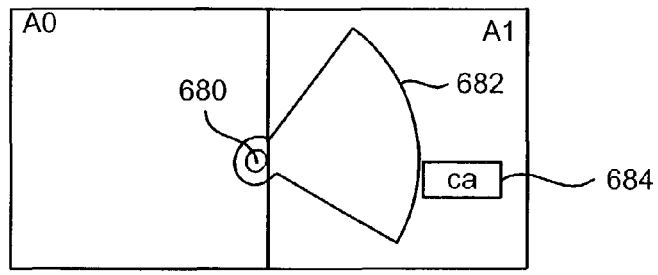
FIGS. 19A and 19B depict an agent crossing from one region to another.
Figure 19B:
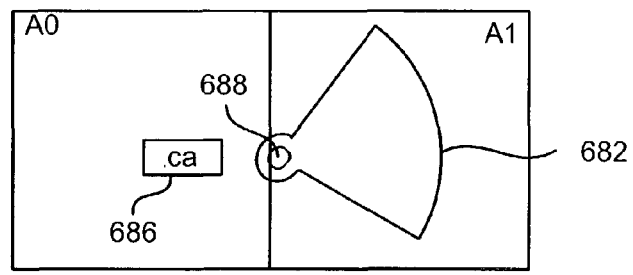

The steps of FIG. 18 will be described with respect to FIGS. 19A and 19B, which graphically illustrate an agent 680 moving from region A0 to region A1. In step 630, the agent 680 determines that it is a border between regions and moving into a new region. That is, agent 680 determines that it is moving from region A0 to region A1. Agent 680 can make such determination based on knowing it's location in region A0. In step 632, the original agent sends a message about the border crossing to a child agent in the simulation server for the new region. That is, agent 680 will send a message to child agent 684 in region A1. In step 634, the original agent sends a child update message to the child agent in the new simulation server. That is, agent 680 will send a child update message to child agent 684 indicating the updated status of agent 680. In step 636, the original agent sends a message to viewer 102 with the IP address and port number for the new simulation server. That is, agent 680 will send a message to the viewer 102 with the IP address and port number used for simulation server 112. In step 638, viewer 102 sends an agent update message. That is, viewer 102 will send a message to child agent 684 instructing child agent 684 to promote itself to a primary agent. In step 640, the original agent (agent 680) will stop being the primary agent and will become a child agent. In step 642, the original child agent will promoted to become the primary agent. FIG. 19B shows the state after step 642. After agent 680 crossed the border, original child agent 684 becomes agent 688 and original agent 680 becomes child agent 686.

Based on the child agent propagation process and the border crossing process described above, it is contemplated that as a user (and agent) moves through a simulation space, different objects will become perceptible and the frustum may enter and leave different regions. As the frustum enters and leaves different regions, and as the user enters and leaves different regions, the user will be in communication with different simulation servers. This system for dynamic communication provides for a user to communicate with those simulation servers associated with regions that it can perceive objects within and not communicate with simulation servers that it cannot perceive objects within. Thus, a simulation server associated with a region having an object that becomes perceivable to the user begins communication with the user and a simulation server for a region that ceases to have objects that are perceivable to the user stops communication with the user. This dynamic starting and stopping of communication is performed in real time during the simulation.

Figure 21A:
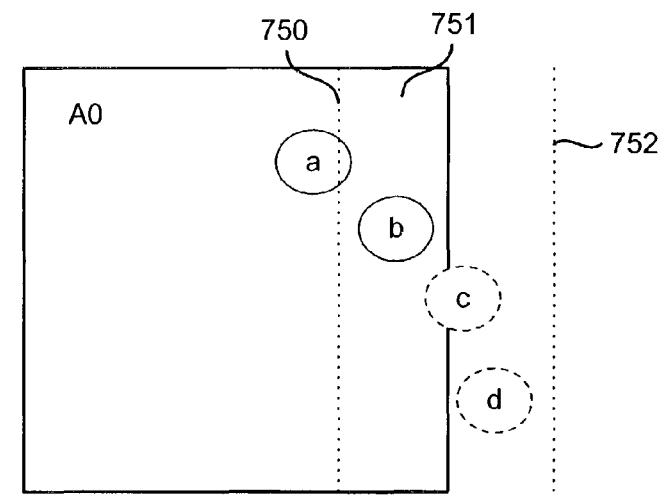
FIGS. 21A and 21B depict an object crossing from one region to another region.
Figure 21B:
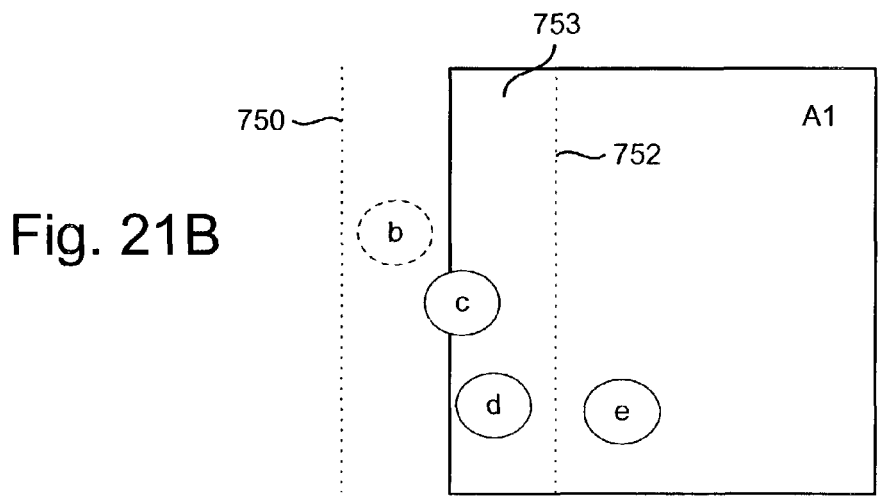

Like an agent, an object can cross from one region to another. For example, a ball can be rolled from a first region to a second region. FIGS. 21A and 21B graphically depict an object moving from region A0 to region A1. At the edge of each region is a border area. In one embodiment, the width of this border area is equal to twice the largest possible radius of any single object's bounding sphere. In another embodiment, the width of the boundary is defined by the formula: Bw=Pr+Pv×(dt+Dp). Where Bw is the border width, Pr is the object bounding sphere radius, Pv is the object velocity magnitude in direction of border, dt is a simulated time between updates, and Dp is the observed packet delay between regions. Objects whose centers are within the boundary area have representations both in the original region and the region adjacent to the border area. The object in the original region is referred to as the 'real object' and the object in the adjacent region is referred to as a 'ghost.' To quickly handle the physical simulation of ghosts across boundaries, a master-slave approach is taken. The real object serves as the master, the ghost serves as the slave. UpdateGhost messages carry information which periodically updates the ghost regarding the position of the real object.

Figure 20:
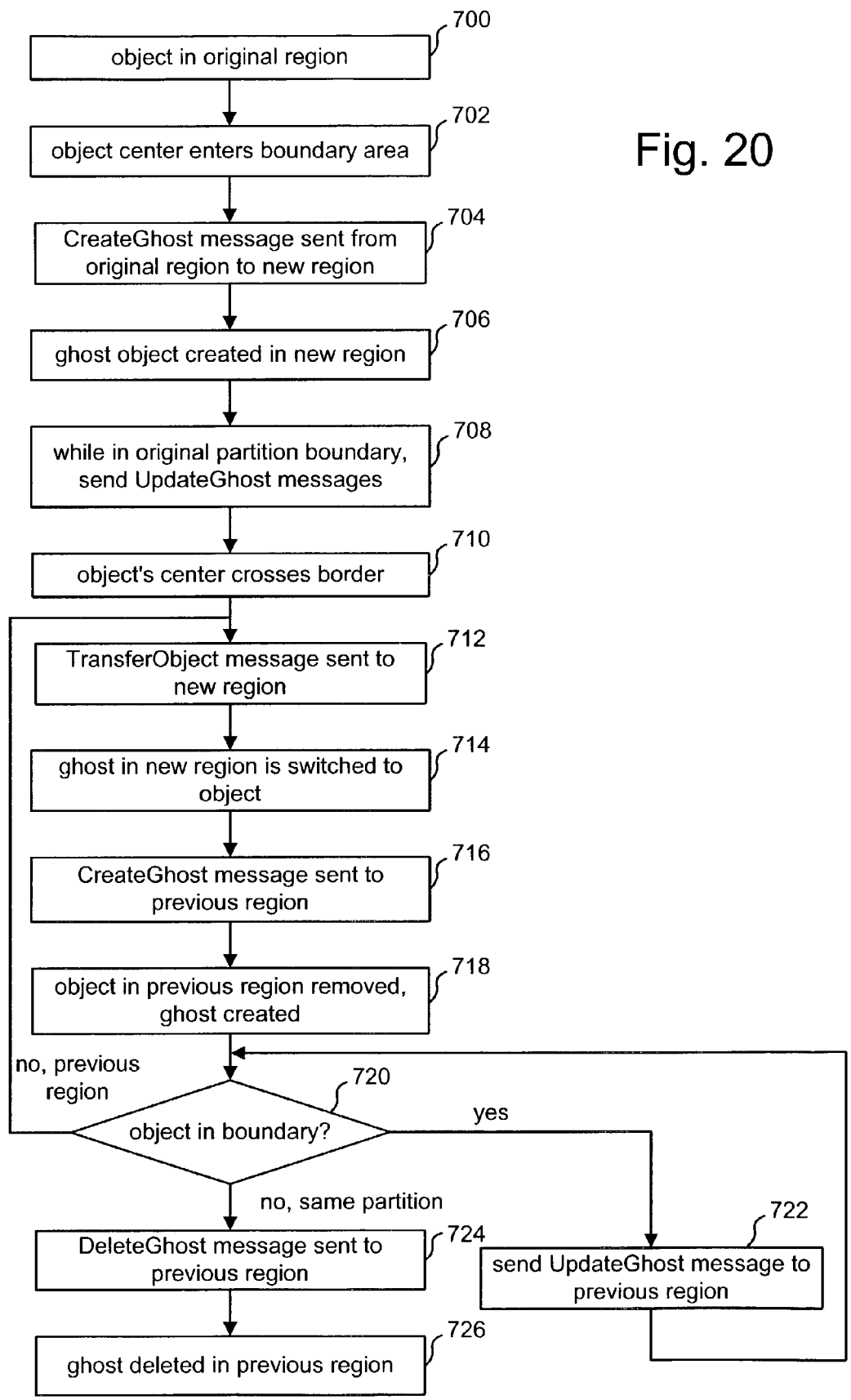
FIG. 20 is a flowchart describing one embodiment of a process performed when an object crosses from one region to another.

FIG. 20 is a flowchart describing the process performed when an object crosses from one region to another. The process of FIG. 20 will be described in conjunction with the graphical depiction of FIGS. 21A and 21B. FIG. 21A shows an object in four positions, A, B, C, and D. These positions are in relation to region A0. Region A0 has a borderline 750 which identifies border region 751 of region A0. Region A1, depicted in FIG. 21B, has a borderline 752 establishing border region 753. FIG. 21B also shows the same object in four positions. Three of the four positions shown in FIG. 21B correspond to positions B, C, and D of FIG. 21A. The fourth position, position E, is different from any position in FIG. 21A. Thus, the two figures show the object moving in five different positions. Position A is completely within region A0 and partially in border region 751. Position B is completely in border region 751. In position C, the object is partly in border region 751 and partly in border region 753. In position D, the object is in border region 773. In position E, the object is completely in region A1. A solid circle represents the object and a dashed circle represents the ghost.

In step 700 of FIG. 20, the object is in the original region, for example, position A in FIG. 21A. In step 702, the center of the object enters a boundary area (see circle B of FIG. 21A). In step 704, a CreateGhost message is sent from the original simulation server of A0 to the simulation server for A1. The CreateGhost message is a request to create a ghost object. The ghost object is created in the new region step 706. For example, in FIG. 21B dashed circle B is created. While the object is in the original region's boundary, UpdateGhost messages are continually sent from the simulation server for region A0 to the simulation server for region A1. This UpdateGhost messages include all the data for the object so that the data will be stored in the simulation server for the region A1 and the ghost can track the object. The object crosses the border between regions in step 710 (see circles C). In step 712, a TransferObject message is sent from the simulation server for region A0 to the simulation server for region A1. This TransferObject message indicates that the object has crossed the border and that the ghost object should become a real object. In step 714, the ghost object is switched to a real object. For example, in FIG. 21B circle C is a solid line indicating it is a real object. In step 716, a CreateGhost message is sent to the simulation server for the previous region. That is, the simulation server for region A1 sends a message to simulator region A0 to create a ghost object. In step 718, the object in the previous region is removed and replaced by the ghost object (e.g. dashed circle C in FIG. 21A is created). In step 720, the simulation server determines whether the object is still in the boundary for the new region (e.g. region A1). If it is still in the boundary area (e.g. region 753), then UpdateGhost messages are continually sent to region A0. If the object has left the boundary area in the new region (e.g., position E in FIG. 21B), then a DeleteGhost message is sent to region A0 and the ghost is removed in step 726. If the object moves back to the previous region, the method loops back to step 712.

FIG. 22 describes a process for adding a new simulation server to the simulation system in real time during a simulation without interrupting the simulation. A new simulation server can be added if an existing simulation server has gone down, has an error, or otherwise needs to be taken off-line. Alternatively, a new simulation server can be added when a new region is added to the simulation space. In step 800, the new simulation server is started. In step 802, the new simulation server contacts space server 130 requesting an assignment of a region to simulate. In step 804, space server 130 assigns a region to the new simulation server and determines the neighbors of that region. For example, if region B2 were assigned to this simulation server, the neighbors determined would be regions A2, B1, and C2. In step 806, space server 134 informs the new simulation server of its region and the IP addresses of the simulation servers for regions that neighbor the new simulation server's region. If the region assigned to the new simulation server is a new region (step 808), then the space server informs the new simulation server of the terrain of its region in step 810. One embodiment of step 810 includes providing all the cell data for land, weather, water, etc. Additionally, initial objects could be inserted into the new region. In one option, the new region can have a blank or empty terrain. In step 812, the new simulation server corrects to its new neighbors. In one embodiment, all communication with neighbors is via UDP packets. In step 814, the new simulation server begins simulating as described herein.

If the new region assigned to the new simulation server is not a new region but an existing region (the new simulation server is replacing an existing simulation server), then (in step 816), the simulation server contacts its new neighbors using UDP messages. In step 818, the new simulation server requests the last good state of its region from its neighbors. During normal operation, each simulation server backs up the simulation data for its associated region, compresses it, and sends the data to all of its neighbors once every two hours (or at a different frequency). Step 818 includes requesting the last back-up that was saved by the neighbors. In step 820, that back-up information is received from at least one of the neighbors. In step 822, that back-up information is used to restore the state of the region. In step 824, the new simulation server begins simulation.

Figure 23:
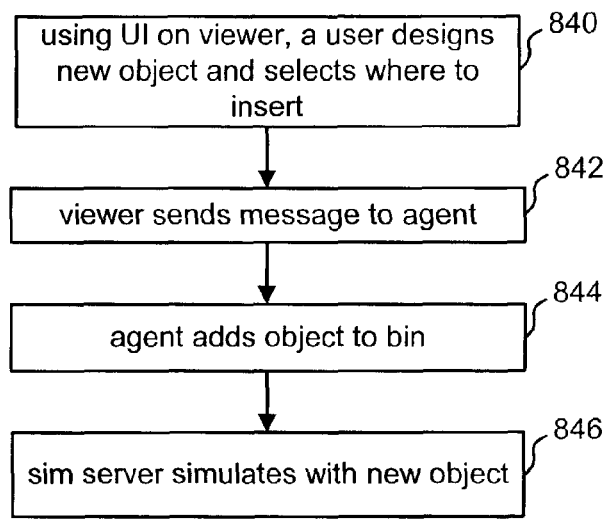
FIG. 23 is a flowchart describing one embodiment of a process for adding a new object to the simulation space.

FIG. 23 describes a process for adding a new object. This is usually performed by a user, but it can be performed by another entity or can be performed automatically by one of the servers. The user interacts with a graphical user interface on the viewer to design a new object and select where to insert the object. The object can be designed using a set of drop down menus to determine all the properties of the object. The user can click on a location in the simulation space that is viewable to the user in order to insert the object. In step 842, viewer 102 sends a message to the agent that indicates the details of the new object. In step 844, the agent adds the object data to the data for the correct bin, determines and stores a checksum for the object and updates the appropriate aggregate checksum. In step 846, the simulation server simulates the simulation space with the new object, described above.

Figure 24:
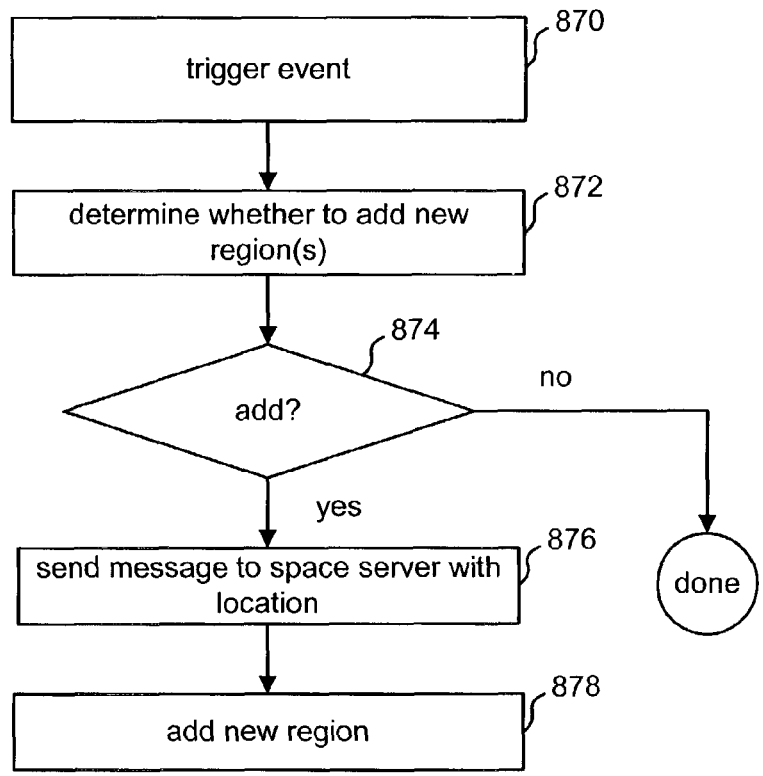
FIG. 24 is a flowchart describing one embodiment of a process for deciding whether to add a new region to the simulation space.

FIG. 24 is a flowchart describing one exemplar processes for deciding whether to add a new region to the simulation space. The process of FIG. 24 can be performed by a simulation server, the space server, a human administrator or another entity. In step 870, a trigger event occurs. One example of a trigger event is that a new object is added to a region. Every time a new object is added a region, a trigger can be inserted that starts the process of FIG. 24. Other examples of trigger events include determining that a certain number of new objects are created, a certain number of objects are in a particular region, a certain number of agents are in a particular region, certain weather conditions exist, certain activity is in a particular region, etc. After a trigger event occurs, a determination is made whether to add a new region to the simulation space. For example, if the trigger event is every time an object is created, then step 872 may include determining whether the number of objects in the region where the new object was created or the number of objects in the simulation space is above a threshold. If so, then a new region should be added. Other tests can also be used, such as object density, number of agents in a region or simulation space, amount of activity in a region, number of users, bandwidth of simulation servers, etc. If a new region is not to be added, then the process of FIG. 24 is completed. If a new region is to be added (step 874), then a message is sent to the space server in step 876 indicating that a new region should be added and the location of where to add the new region. In another embodiment, the space server determines where to add the new region. In one embodiment, the space server automatically determines the terrain of the new region. The new terrain can be determined randomly, according to a preconfigured plan, or by continuing or interpolating the terrain of one or more neighboring regions. Alternatively, a human administrator or user can inform the space server of the new terrain. In step 878, the new region is added by creating the region (or subdividing an existing region) and starting a new simulator according to the process of FIG. 22. Alternatively, a new region can be added manually. A human administrator of the simulation space could be provided with information of the trigger event and the administrator can decided whether to add the new region. In one embodiment, the number of objects that can be added to the simulation space is unlimited because as the simulation space fills up with objects, new regions can be added with new simulation servers.

In an alternative embodiment, one or more proxies can be used to facilitate communication between simulation servers and viewers. In one alternative, each simulation server would have a proxy. All of the agents for that simulation server would communicate with the proxy and the proxy would communicate with all of the viewers who need information from that simulation server. In one option, the simulation server would communicate the proxy without using the agents. In another alternative, multiple simulation servers can share one or more proxies. Proxies allow multiple viewers to communicate with the same simulation server, while reducing the communication load on the simulation server.

In another alternative embodiment, regions not being actively viewed are moved to one or more offline simulation servers, freeing up simulation servers for other tasks such as assisting other simulation servers, simulating new regions, or sharing multiple regions among a smaller number of simulation servers.

In one embodiment, each agent may have a bandwidth limitation. In a given time step, an agent may reach its bandwidth budget. If this occurs, the agent should stop its activities, transmit existing data and reset its activities to the closest bin in the frustum for the next time step. This allows highly visible activity in the foreground (near the user) to take precedence over distant objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A machine implemented method of simulating, comprising:
   performing a continuous distributed simulation of a space using a plurality of computing devices connected to a network, each computing device of the plurality of computing devices simulates a different region of the space, performing the continuous distributed simulation includes reporting about the simulation to a user computer device;
   determining whether an item has changed; if the item has changed, determining whether a particular change for the item would be perceptible on the user computing device based on one or more properties of the item in the space and a physical property of a user interface on the user computing device;
   transmitting data about the change to the user computing device if it was determined that the particular change would be perceptible on the user computing device and not transmitting the data about the change to the user computing device if it was determined that the particular change would be not be perceptible on the user computing device, wherein the physical property of the user interface on the user computing device is display resolution.

2. A system for simulating a space that can be accessed by a user computing device, comprising:
   a plurality of computing devices in communication with a network, the plurality of computing devices perform a continuous distributed simulation of a space such that each computing device of the plurality simulates a different region of the space; and
   an agent process on one of the plurality of computing devices, the agent process is in communication the user computing device, the agent process determines whether an item in the space has changed, if the item has changed the agent process determines whether a particular change would be perceptible on the user computing device based on one or more properties of the item in the space and a physical property of a user interface on the user computing device, the agent transmits data about the change to the user computing device if it was determined that the particular change would be perceptible on the user computing device, the agent does not transmit the data about the change to the user computing device if it was determined that the particular change would be not be perceptible on the user computing device, wherein the physical property of the user interface on the user computing device is display resolution.

3. The method of claim 1, wherein:
   at least one of the plurality of computing devices includes an agent process in communication with the user computing device; and
   the determining of whether the item has changed and whether the particular change is perceptible are performed by the agent process.

4. The method of claim 1, wherein:
   the determining of whether the item has changed and whether the particular change is perceptible are performed at the plurality of computing devices.

5. The method of claim 1, wherein:
   the on one or more properties of the item in the space include size of the item and distance to the item from a location representing point of view for the user computing device.

6. The method of claim 1, wherein:
   determining whether a particular change for the item would be perceptible on the user computing device includes determining whether an image of the item will move on a display of the user computing device by more than a predetermined number of pixels.

7. The system of claim 2, wherein:
   the on one or more properties of the item in the space include size of the item and distance to the item from a location representing point of view for the user computing device.

8. The system of claim 2, wherein:
   the agent process determines whether a particular change would be perceptible by determining whether an image of the item will move on a display of the user computing device by more than a predetermined number of pixels.

* * * * *